(12) United States Patent
Hamade et al.

(10) Patent No.: US 11,327,327 B2
(45) Date of Patent: May 10, 2022

(54) IMAGE DISPLAY DEVICE AND VIRTUAL IMAGE DISPLAY DEVICE

(71) Applicant: SEIKO EPSON CORPORATION, Tokyo (JP)

(72) Inventors: Yuiga Hamade, Matsumoto (JP); Hidetoshi Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 146 days.

(21) Appl. No.: 16/802,790

(22) Filed: Feb. 27, 2020

(65) Prior Publication Data
US 2020/0278559 A1    Sep. 3, 2020

(30) Foreign Application Priority Data

Feb. 28, 2019    (JP) .............. JP2019-036986

(51) Int. Cl.
*G02B 27/14*    (2006.01)
*H01L 27/32*    (2006.01)
(Continued)

(52) U.S. Cl.
CPC ....... *G02B 27/141* (2013.01); *G02B 27/0172* (2013.01); *G03B 33/12* (2013.01);
(Continued)

(58) Field of Classification Search
CPC .... G03B 21/02; G03B 21/006; G03B 21/008; G03B 21/28; G03B 21/145; G03B 21/208; G03B 21/2013; G03B 21/2033; G02B 2027/0112; G02B 2027/0114; G02B 2027/0134; G02B 2027/0172; G02B 2027/0178; G02B 27/01; G02B 27/09; G02B 27/0101; G02B 27/0172; G02B 27/141

See application file for complete search history.

(56) References Cited

U.S. PATENT DOCUMENTS

2004/0027545 A1*    2/2004    Yokoyama ........ G02F 1/133621
                                                                                                              353/52
2012/0138976 A1*    6/2012    Fujita .................. H01L 51/5012
                                                                                                              257/88
(Continued)

FOREIGN PATENT DOCUMENTS

JP              2000-275732 A      10/2000

*Primary Examiner* — Sultan Chowdhury
(74) *Attorney, Agent, or Firm* — Oliff PLC

(57) ABSTRACT

An image display device according to the present disclosure includes a first self-light-emitting display element that emits light for an image of red light, a second self-light-emitting display element that emits light for an image of blue light, a third self-light-emitting display element that emits light for an image of green light, and a prism having a dichroic mirror that synthesizes images of three colors, in which the first self-light-emitting display element, the second self-light-emitting display element, and the third self-light-emitting display element have a first cathode, a second cathode, and a third cathode, respectively, and when a film thickness of the first cathode is referred to as TR, a film thickness of the second cathode is referred to as TB, and a film thickness of the third cathode is referred to as TG, a relationship TR<TG is satisfied.

11 Claims, 14 Drawing Sheets

(51) Int. Cl.
*G03B 33/12* (2006.01)
*G02B 27/01* (2006.01)

(52) U.S. Cl.
CPC .. H01L 27/3232 (2013.01); *G02B 2027/0114* (2013.01); *G02B 2027/0178* (2013.01)

(56) References Cited

U.S. PATENT DOCUMENTS

| | | | |
|---|---|---|---|
| 2015/0279114 A1* | 10/2015 | Yonekubo | G06T 19/006 345/633 |
| 2018/0287064 A1* | 10/2018 | Matsueda | H01L 51/001 |
| 2018/0351113 A1* | 12/2018 | Ahn | H01L 51/0074 |
| 2019/0006427 A1* | 1/2019 | Lu | H01L 27/3276 |
| 2019/0013364 A1* | 1/2019 | Yokota | H01L 51/5056 |
| 2019/0115551 A1* | 4/2019 | Jiao | H01L 51/5008 |

* cited by examiner

IMAGE DISPLAY DEVICE AND VIRTUAL IMAGE DISPLAY DEVICE

The present application is based on, and claims priority from JP Application Serial Number 2019-036986, filed Feb. 28, 2019, the disclosure of which is hereby incorporated by reference herein in its entirety.

BACKGROUND

1. Technical Field

The present disclosure relates to an image display device including a self-light-emitting display element, and a virtual image display device.

2. Related Art

In recent years, as an image display device using a panel provided with a self-light-emitting display element, a device configured such that a panel including three self-light-emitting display elements that emit light of various colors such as a red color, a green color, and a blue color is arranged so as to face three incident surfaces of a dichroic prism has been proposed.

In this image display device, the panel including the self-light-emitting display elements is composed of an organic electroluminescent panel (organic EL panel), and, for example, while red color image light emitted from a red color organic electroluminescent panel is reflected by a first dichroic mirror toward an emission surface, the first dichroic mirror transmits blue color image light emitted from a blue color organic electroluminescent panel, and green color image light emitted from a green color organic electroluminescent panel.

Further, while the blue color image light emitted from the blue color organic electroluminescent panel is reflected by a second dichroic mirror toward an emission surface, the second dichroic mirror transmits the red color image light emitted from the red color organic electroluminescent panel, and the green color image light emitted from the green color organic electroluminescent panel.

Thus, synthesized light that is a synthesis of the images of the red light, the green light, and the blue light is emitted from the emission surfaces of the dichroic prism, and a color image can thus be displayed by the image display device (for example, refer to JP-A-2000-275732).

Here, in the image display device described in JP-A-2000-275732, an organic EL panel includes an organic EL element as a back light, and a liquid crystal display disposed between the organic EL element and a dichroic mirror, to form images of a red color, a green color, and a blue color.

This JP-A-2000-275732 describes that, since the organic EL element as the back light is configured to include a microresonator in the image display device, and the organic EL element may be caused to emit red, green, and blue light, but a specific method of adjusting color is not described in reality.

SUMMARY

The present disclosure is made to address the above-described issues, and can be realized as the following application examples.

An image display device according to an application example of the present disclosure includes a first self-light-emitting display element configured to self-emit light for an image of red light having a peak in a red region, a second self-light-emitting display element configured to self-emit light for an image of blue light having a peak in a blue region, a third self-light-emitting display element configured to self-emit light for an image of green light having a peak in a green region, and a prism having a dichroic mirror configured to synthesize three colors, that is, the red light emitted from the first self-light-emitting display element, the blue light emitted from the second self-light-emitting display element, and the green light emitted from the third self-light-emitting display element, in which the first self-light-emitting display element, the second self-light-emitting display element, and the third self-light-emitting display element include a first cathode, a second cathode, and a third cathode, respectively, and when a film thickness of the first cathode is referred to as TR, a film thickness of the second cathode is referred to as TB, and a film thickness of the third cathode is referred to as TG, a relationship TR<TG is satisfied.

DESCRIPTION OF EXEMPLARY EMBODIMENTS

Figure 1:
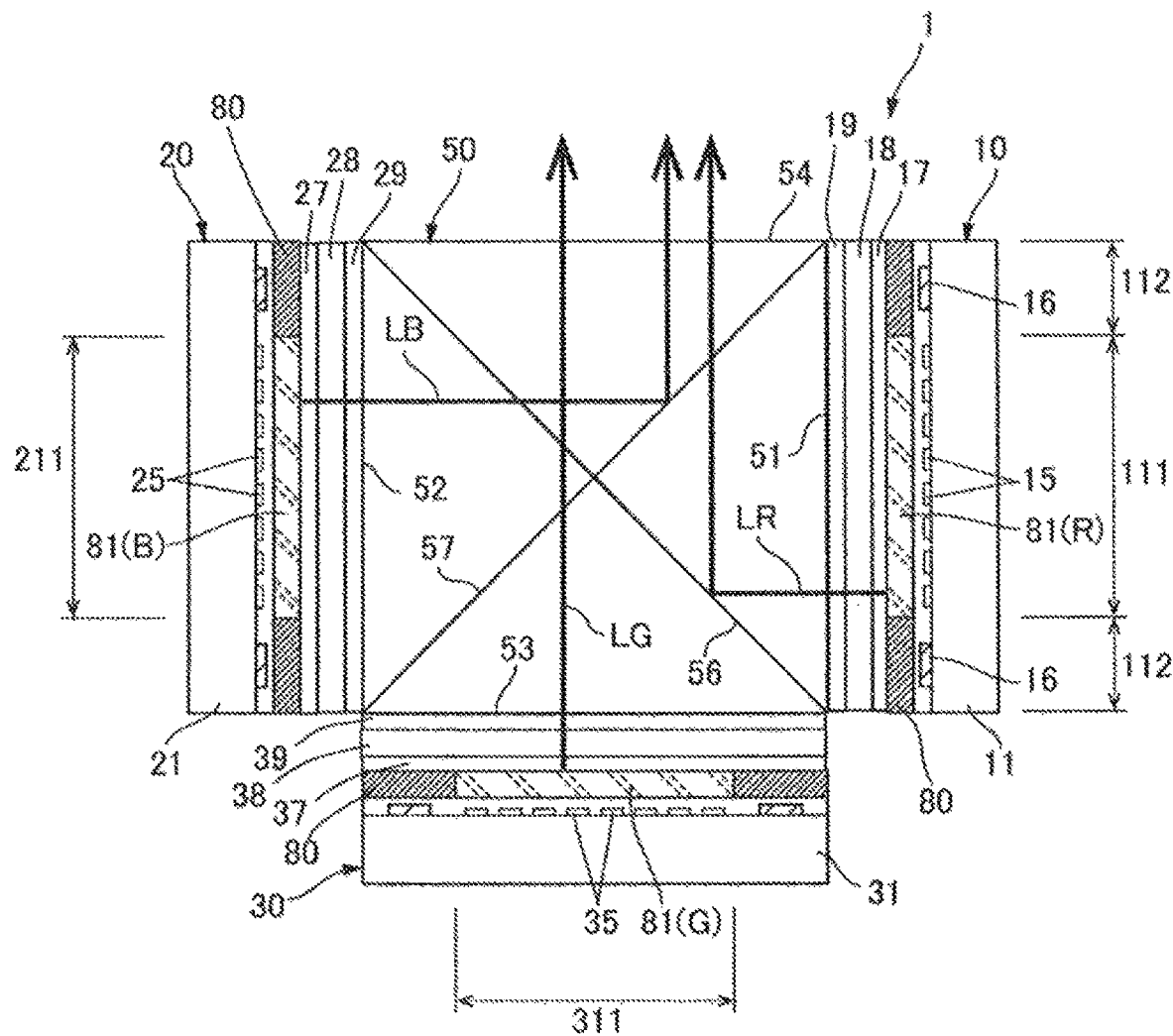
FIG. 1 is a plan view illustrating an exemplary embodiment of an image display device according to the present disclosure.

Hereinafter, an image display device and a virtual image display device of the present disclosure will be described in connection with preferable exemplary embodiments illustrated in accompanied drawings.

Hereinafter, a case will be described in which the image display device according to the present disclosure is applied to a device including an organic electroluminescence element (organic EL element) as a light-emitting element. In addition, in the drawings, for convenience of explanation, scale of each part is changed as appropriate, and an illustrated configuration does not necessarily match an actual scale.

Image Display Device

Figure 2:
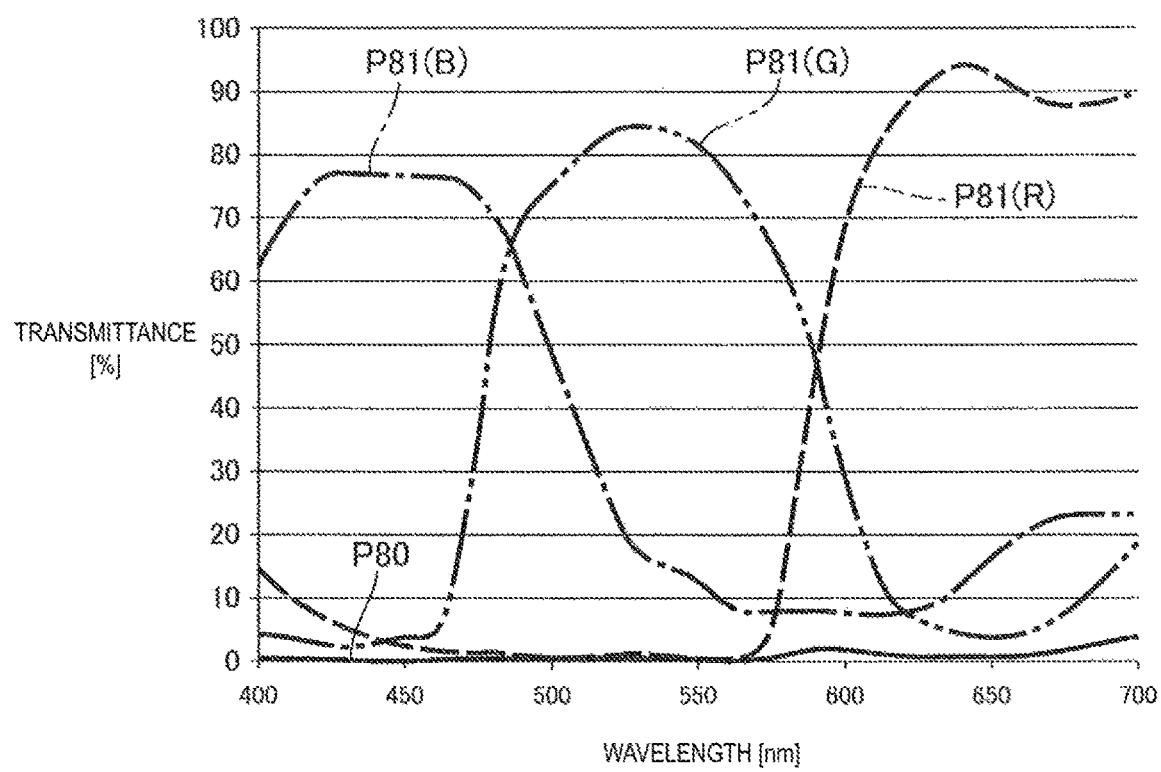
FIG. 2 is a graph illustrating transmittance-wavelength characteristics of a first coloring layer and the like illustrated in FIG. 1.
Figure 3:
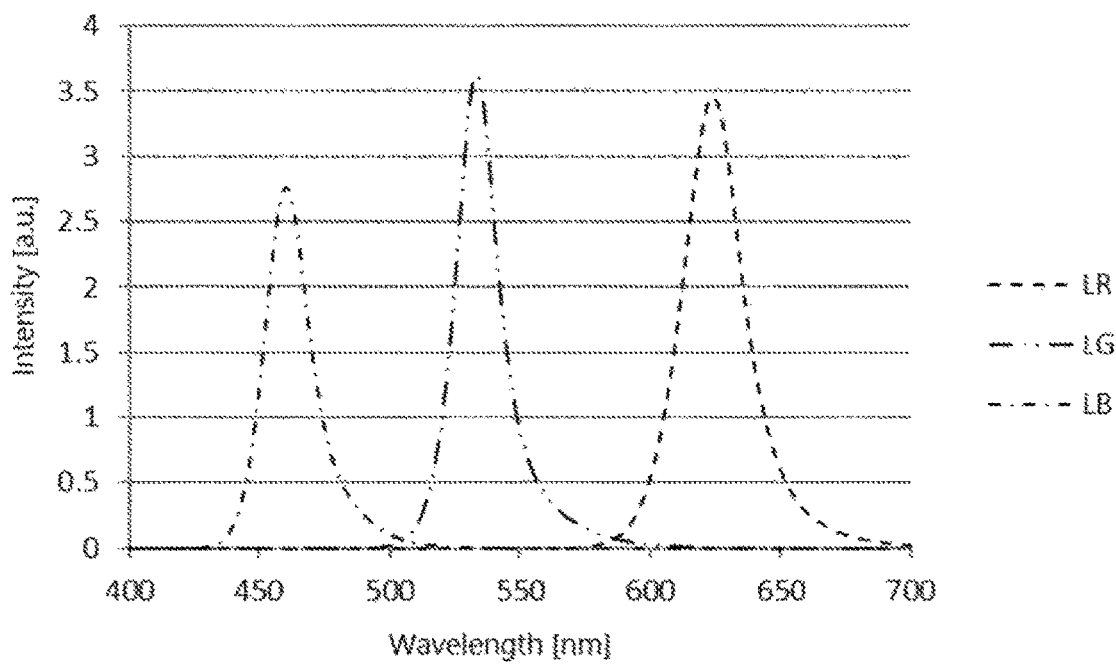
FIG. 3 is a graph illustrating a spectrum of first image light and the like illustrated in FIG. 1.
Figure 4:
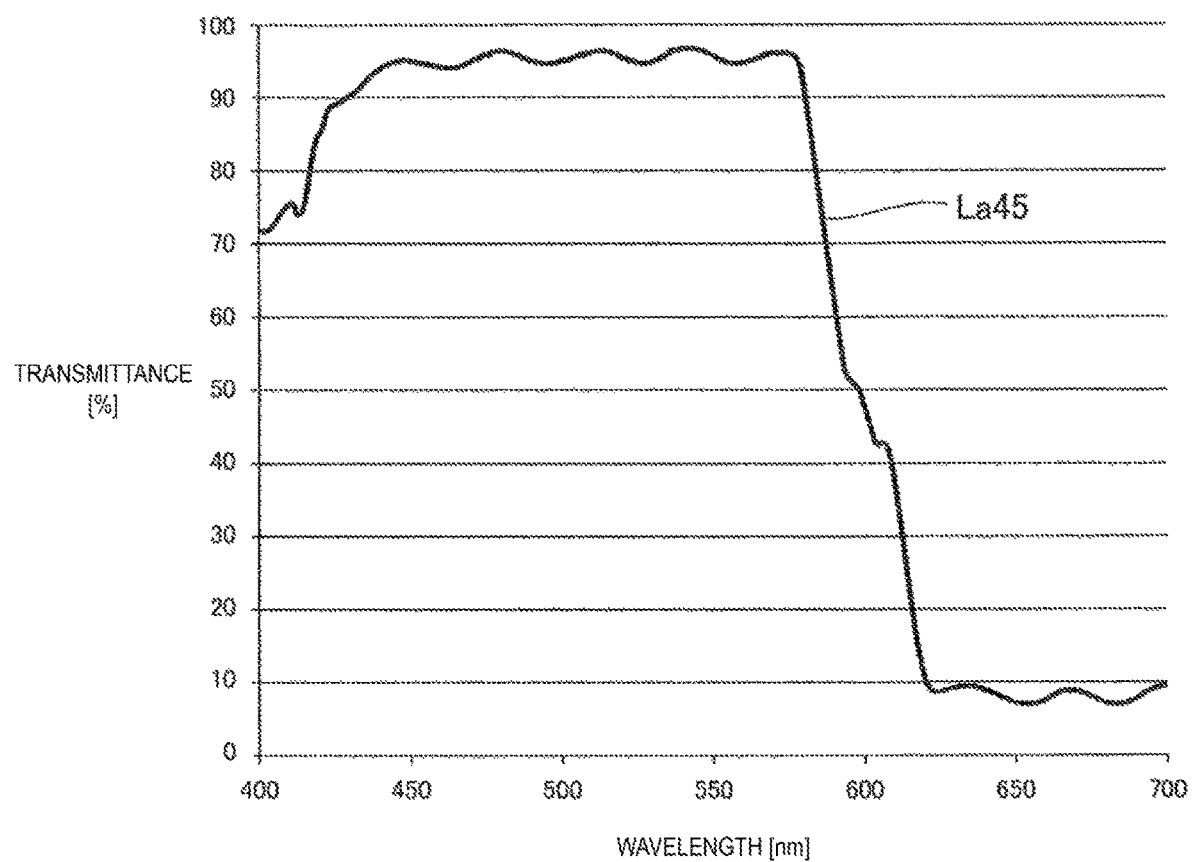
FIG. 4 is a graph illustrating transmittance-wavelength characteristics of a first dichroic mirror illustrated in FIG. 1.
Figure 5:
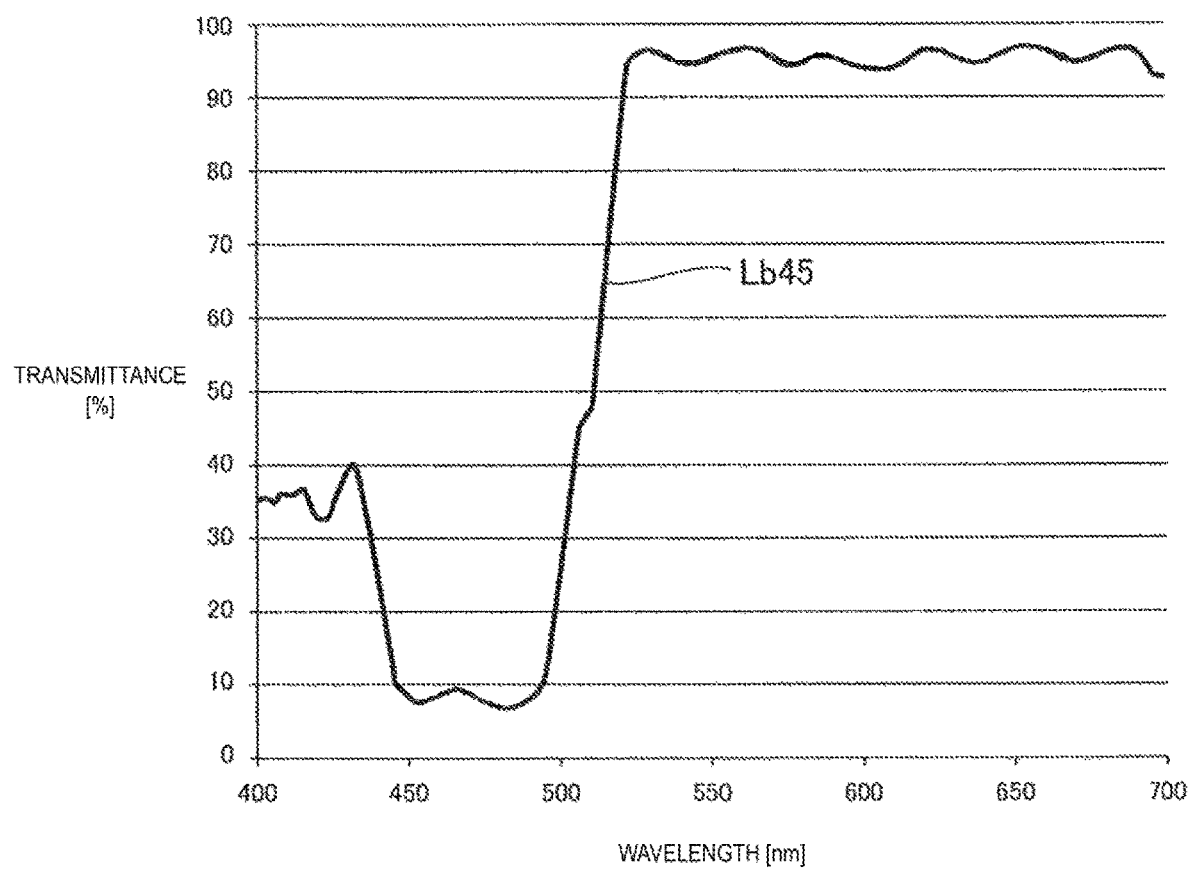
FIG. 5 is a graph illustrating transmittance-wavelength characteristics of a second dichroic mirror illustrated in FIG. 1.

Overall Configuration FIG. 1 is a plan view illustrating an exemplary embodiment of an image display device of the present disclosure, FIG. 2 is a graph illustrating transmittance-wavelength characteristics of a first coloring layer (R) and the like illustrated in FIG. 1, FIG. 3 is a graph illustrating a spectrum of first image light LR and the like illustrated in FIG. 1, FIG. 4 is a graph illustrating transmittance-wavelength characteristics of a first dichroic mirror 56 illustrated in FIG. 1, and FIG. 5 is a graph illustrating transmittance-wavelength characteristics of a second dichroic mirror 57 illustrated in FIG. 1.

As illustrated in FIG. 1, an image display device 1 includes a first panel 10 provided with a plurality of first light-emitting devices 15 in a first display region 111 that is a display region of a first substrate 11, a second panel 20 provided with a plurality of second light-emitting devices 25 in a second display region 211 that is a display region of a second substrate 21, a third panel 30 provided with a plurality of third light-emitting devices 35 in a third display region 311 that is a display region of a third substrate 31, and a dichroic prism 50.

The first panel 10 emits first image light LR being red light having a peak in a red region from the first display region 111 by light emission of the plurality of first light-emitting devices 15, and the second panel 20 emits second image light LB being blue light having a peak in a blue region from the second display region 211 by light emission of the plurality of second light-emitting devices 25, and the third panel 30 emits third image light LG being green light having a peak in a green region from the third display region 311 by light emission of the plurality of third light-emitting devices 35. Note that, a first wavelength region, a second wavelength region, and a third wavelength region are different from each other, but parts thereof may overlap.

In the present exemplary embodiment, the red region is from 600 nm to 700 nm, for example, and the first panel 10 emits the first image light LR being the red light having the peak in the region. The blue region is from 450 nm to 495 nm, for example, and the second panel 20 emits the second image light LB being the blue light having the peak in the region. The green region is from 495 nm to 570 nm, for example, and the third panel 30 emits the third image light LG being the green light having the peak in the region.

In the image display device 1 described above, the first panel 10 emits the red color image light by the light emission of the plurality of first light-emitting devices 15 provided in the first display region 111, and in the first substrate 11, the first panel 10 is provided with, on a side of the dichroic prism 50 with respect to the first light-emitting devices 15, a first coloring layer 81(R) that can selectively transmit the red color image light emitted from the first light-emitting devices 15, or the first image light LR having the peak in the red region.

The second panel 20 emits the blue color image light by the light emission of the plurality of second light-emitting devices 25 provided in the second display region 211, and in the second substrate 21, the second panel 20 is provided with, on a side of the dichroic prism 50 with respect to the second light-emitting devices 25, a second coloring layer 81(B) that can selectively transmit the blue color image light emitted from the second light-emitting devices 25, or the second image light LB having the peak in the blue region.

The third panel 30 emits the green color image light by the light emission of the plurality of third light-emitting devices 35 provided in the third display region 311, and in the third substrate 31, the third panel 30 is provided with, on a side of the dichroic prism 50 with respect to the third light-emitting devices 35, a third coloring layer 81(G) that can selectively transmit the green color image light emitted from the third light-emitting devices 35, or the third image light LG having the peak in the green region.

In the present exemplary embodiment, all of the first light-emitting device 15, the second light-emitting device 25, and the third light-emitting device 35 included in the first panel 10, the second panel 20, and the third panel 30 respectively, are configured with organic electroluminescent elements, and the plurality of first light-emitting devices 15, the plurality of second light-emitting devices 25, and the plurality of third light-emitting devices 35 emit the red color image light, the blue color image light, and the green color image light, respectively. In other words, in the panels 10, 20, and 30 of the present exemplary embodiment, the plurality of first light-emitting devices 15 configure a first self-light-emitting display element that emits light for an image of the red light, and the plurality of second light-emitting devices 25 configure a second self-light-emitting display element that emits light for an image of the blue light, and the plurality of third light-emitting devices 35 configure a third self-light-emitting display element that emits light for an image of the green light.

The first coloring layer 81(R), for example, has transmittance-wavelength characteristics indicated by a dashed line P81(R) in FIG. 2, and is a light-absorbing filter layer that absorbs light other than the red light. Next, the second coloring layer 81(B) has transmittance-wavelength characteristics indicated by a one-dot chain line P81(B), and is a light absorbing filter layer that absorbs light other than the blue light. Next, the third coloring layer 81(G) has transmittance-wavelength characteristics indicated by a two-dot chain line P81(G), and is a light absorbing filter layer that absorbs light other than the green light.

Thus, as illustrated in FIG. 3, the first image light LR indicates the red color image light having a spectrum indicated by a dashed line LR due to an action of the first light-emitting device 15 and the first coloring layer 81 (R), the second image light LB indicates the blue color image light having a spectrum indicated by a one-dot chain line LB due to an action of the second light-emitting device 25 and the second coloring layer 81(B), and the third image light LG indicates the green color image light having a spectrum indicated by a two-dot chain line LG due to an action of the third light-emitting device 35 and the third coloring layer 81(G).

The dichroic prism 50 (prism) includes a first incident surface 51, a second incident surface 52 that faces the first incident surface 51, a third incident surface 53 that is provided between the first incident surface 51 and the second incident surface 52, and an emission surface 54 that faces the third incident surface 53. The first panel 10 is arranged so as to face the first incident surface 51, and the first image light LR being the red light emitted from the first panel 10 is incident on the first incident surface 51. The second panel 20 is arranged so as to face the second incident surface 52, and the second image light LB being the blue light emitted from the second panel 20 is incident on the second incident surface 52. The third panel 30 is arranged so as to face the third incident surface 53, and the third image light LG being the green light emitted from the third panel 30 is incident on the third incident surface 53. The first incident surface 51 and the first panel 10 are fixed via a transmissive adhesive 19, the second incident surface 52 and the second panel 20 are fixed via a transmissive adhesive 29, and the third incident surface 53 and the third panel 30 are fixed via a transmissive adhesive 39.

Further, the dichroic prism 50 includes the first dichroic mirror 56, and the second dichroic mirror 57 that are arranged so as to intersect each other at a 45 degree angle.

As a solid line La45 illustrated in FIG. 4, of light that is incident at a 45 degree angle, the first dichroic mirror 56 allows light having a wavelength of approximately 550 nm or smaller to pass through and reflects light having a wavelength of approximately 600 nm or greater. Further, with regard to light having a wavelength from 550 nm to 600 nm, the longer the wavelength, the lower the transmittance. Thus, the first dichroic mirror 56 reflects the first image light LR toward the emission surface 54 and transmits the second image light LB and the third image light LG.

Additionally, as a solid line Lb45 illustrated in FIG. 5, of light that is incident at a 45 degree angle, the second dichroic mirror 57 allows light having a wavelength of approximately 520 nm or greater to pass through and reflects light having a wavelength of approximately 490 nm or smaller. Further, with regard to light having a wavelength from 490 nm to 520 nm, the longer the wavelength, the greater the transmittance. Thus, the second dichroic mirror 57 reflects the second image light LB toward the emission surface 54 and transmits the first image light LR and the third image light LG. Thus, the dichroic prism 50 emits, from the emission surface 54, a color image obtained by synthesizing the first image light LR being the red color emitted from the first panel 10, the second image light LB being the blue color emitted from the second panel 20, and the third image light LG being the green color emitted from the third panel 30, by an action of the first dichroic mirror 56 and the second dichroic mirror 57.

Electrical Configuration of First Panel 10

Figure 6:
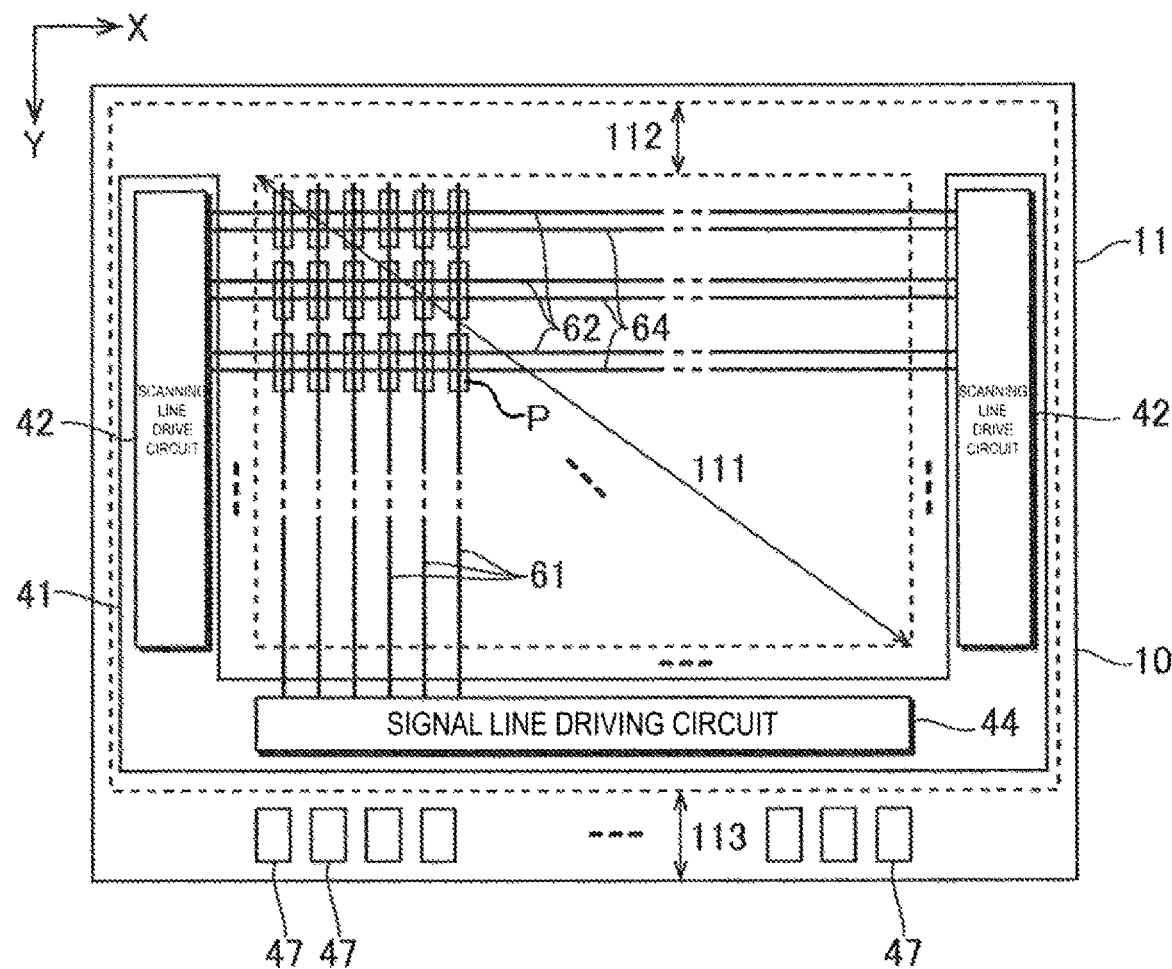
FIG. 6 is an explanatory diagram illustrating an electrical configuration of a first panel illustrated in FIG. 1.
Figure 7:
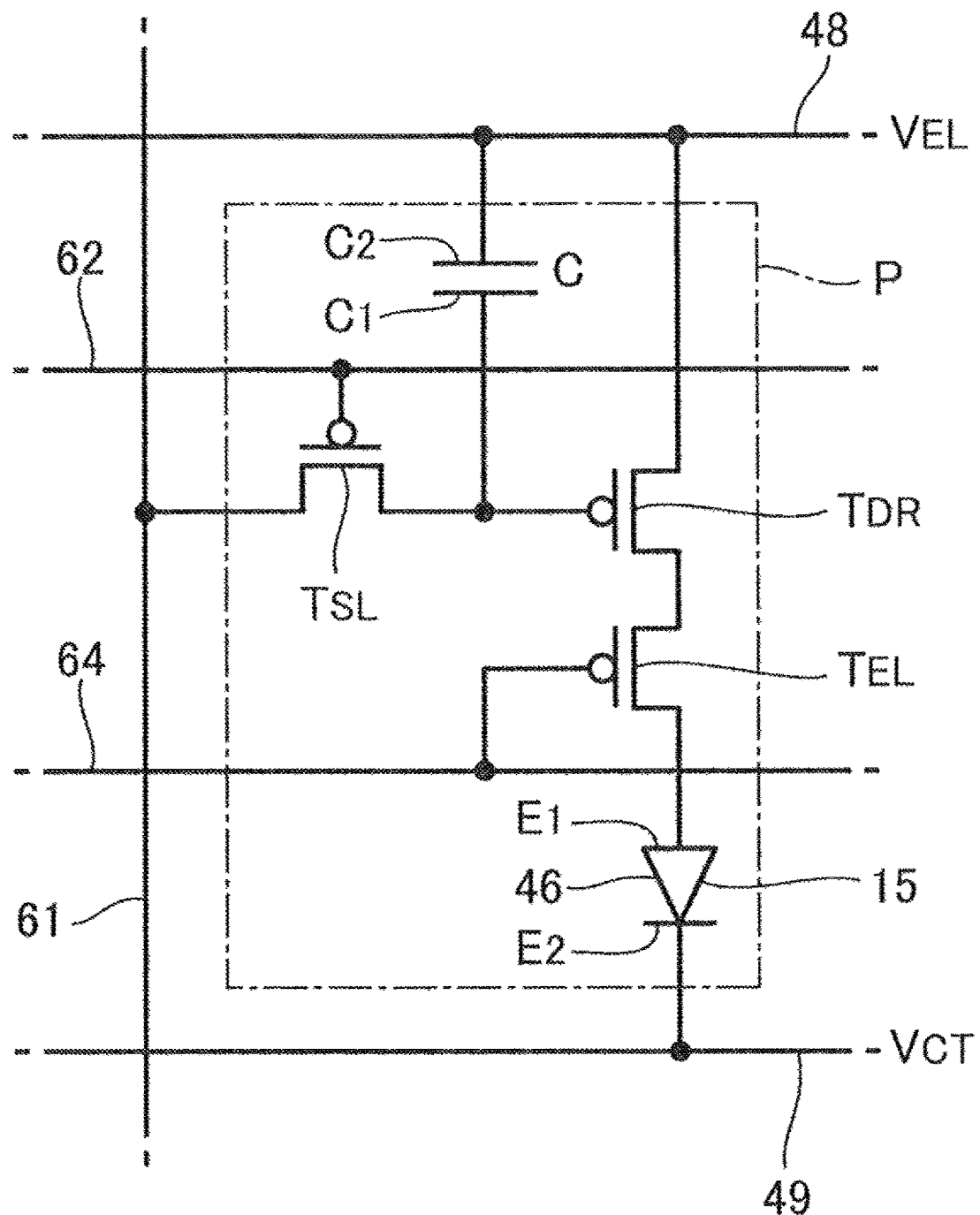
FIG. 7 is a circuit diagram of each of pixels (pixel circuits) in a first display region illustrated in FIG. 6.

FIG. 6 is an explanatory diagram illustrating an electrical configuration of the first panel 10 illustrated in FIG. 1, and FIG. 7 is a circuit diagram of each of pixels (pixel circuits) in the first display region 111 illustrated in FIG. 6. Note that, in the following description, for easy understanding of the description, a sheet front side in FIG. 6, is referred to as a "top", and a sheet depth side is referred to as a "bottom".

As illustrated in FIG. 6, in the first panel 10, the first display region 111, a peripheral area 112, and a mounting region 113 are provided on an upper surface or one surface of the first substrate 11. In the present exemplary embodiment, in the first panel 10, the first substrate 11 is configured with a semiconductor substrate of silicon or the like. In this first substrate 11, the first display region 111 is a rectangular region in which a plurality of pixels P are arrayed. A plurality of scanning lines 62 that extend in an X direction, a plurality of control lines 64 that extend in the X direction in corresponding to each of the scanning lines 62, and a plurality of signal lines 61 that extend in a Y direction intersecting the X direction are formed in the first display region 111. The pixels P are formed corresponding to each intersection of the plurality of scanning lines 62 and the plurality of signal lines 61. Thus, the plurality of pixels P are arrayed in a matrix or in a lattice-like manner over the X direction and the Y direction. Note that, the pixel P is formed having a size of approximately 10 μm or less on one side.

The peripheral area 112 is a rectangular frame-shaped region that surrounds a periphery of the first display region 111. A driving circuit 41 is provided in the peripheral area 112. The driving circuit 41 is a circuit that drives each of the pixels P inside the first display region 111, and is configured so as to include two scanning line drive circuits 42 and a signal line driving circuit 44. The first panel 10 of the present exemplary embodiment is a circuit incorporating display device in which the drive circuit 41 is configured by active elements, such as a transistor, formed directly at the surface of the first substrate 11.

The mounting region 113 is a region on the opposite side of the first display region 111 with the peripheral area 112 positioned therebetween, and a plurality of mounting terminals 47 are arrayed in the mounting region 113. Control signals and a power supply potential are supplied to each of the mounting terminals 47 from various external circuits such as a control circuit and a power supply circuit, which are not illustrated. The external circuits are mounted on a flexible wiring substrate, which is not illustrated, this flexible wiring substrate being bonded to the mounting region 113, for example.

As illustrated in FIG. 7, the pixel P is configured so as to include the first light-emitting device 15, a drive transistor TDR, a light emission control transistor TEL, a selection transistor TSL, and a capacitance element C. Note that, in FIG. 7, the transistors TDR, TEL, and TSL of the pixel P, are p-channel type transistors, but n-channel type transistors can also be used.

The first light-emitting device 15 is an organic EL element or an electro-optical element in which a light emission functional layer 46 that includes a light-emitting layer of an organic EL material is interposed between a first electrode E1 or a anode and a second electrode E2 or a cathode. The first electrode E1 is formed individually for each of the pixels P, and the second electrode E2 is continuous across the plurality of pixels P. The first light-emitting device 15 is arranged on a current path that couples a first power supply conductor 48 and a second power supply conductor 49. The first power supply conductor 48 is a power supply line to which a higher-side power supply potential VEL (a first potential) is supplied, and the second power supply conductor 49 is a power supply line to which a lower-side power supply potential VCT (a second potential) is supplied.

The drive transistor TDR and the light emission control transistor TEL are arranged on the current path, which couples the first power supply conductor 48 and the second power supply conductor 49, in series with the first light-emitting device 15. Specifically, one (a source) of a pair of current terminals of the drive transistor TDR is coupled to the first power supply conductor 48. The light emission control transistor TEL functions as a switch that controls a conductive state (conductive/non-conductive) between another (a drain) of the pair of current terminals of the drive transistor TDR, and the first electrode E1 of the first light-emitting device 15. The drive transistor TDR generates a drive current of an amperage corresponding to a voltage between a gate and the source of the drive transistor TDR. In a state in which the light emission control transistor TEL is controlled to be ON, the drive current is supplied from the drive transistor TDR to the first light-emitting device 15 via the light emission control transistor TEL, and the first light-emitting device 15 thus emits light at a luminance corresponding to the amperage of the drive current. In a state in which the light emission control transistor TEL is controlled to be OFF, the supply of the drive current to the first light-emitting device 15 is cut off, and the first light-emitting device 15 is thus extinguished. A gate of the light emission control transistor TEL is coupled to the control line 64.

The selection transistor TSL functions as a switch that controls a conductive state (conductive/non-conductive) between the signal line 61 and the gate of the drive transistor TDR. A gate of the selection transistor TSL is coupled to the scanning line 62. Further, the capacitance element C is an electrostatic capacitance with a dielectric substance interposed between a first electrode C1 and a second electrode C2. The first electrode C1 is coupled to the gate of the drive transistor TDR, and the second electrode C2 is coupled to the first power supply conductor 48 (the source of the drive transistor TDR). Thus, the capacitance element C holds the voltage between the gate and source of the drive transistor TDR.

The signal line driving circuit 44 supplies a gradation potential depending on a grayscale specified for each of the pixels P by an image signal supplied from an external circuit, to the plurality of signal lines 61, in parallel, for each writing period (horizontal scanning period). Meanwhile, by supplying a scanning signal to each of the scanning lines 62, each of the scanning line drive circuits 42 sequentially selects each of the plurality of scanning lines 62 for each writing period. The selection transistor TSL of each of the pixels P corresponding to the scanning line 62 selected by the scanning line drive circuits 42 switches to an ON state. Thus, the gradation potential is supplied to the gate of the drive transistor TDR of each of the pixels P, via the signal line 61 and the selection transistor TSL, and a voltage according to the gradation potential is held in the capacitance element C. Meanwhile, when the selection of the scanning lines 62 in the writing period ends, each of the scanning line drive circuits 42 supplies a control signal to each of the control lines 64, thus controlling the light emission control transistor TEL of each of the pixels P corresponding to the control lines 64 to be in an ON state. Thus, a drive current that accords with the voltage held in the capacitance element C in the immediately preceding writing period is supplied to the first light-emitting device 15 from the drive transistor TDR via the light emission control transistor TEL. In this way, the first light-emitting device 15 emits light at a luminance that accords with the gradation potential. As a result, the desired first image light LR specified by the image signal is emitted from the first display region 111. In other words, because the first panel 10 has such an electrical configuration, the desired first image light LR can be emitted by the plurality of first light-emitting devices 15 alone without using a liquid crystal panel.

Cross-Sectional Configuration of First Panel 10

Figure 8:
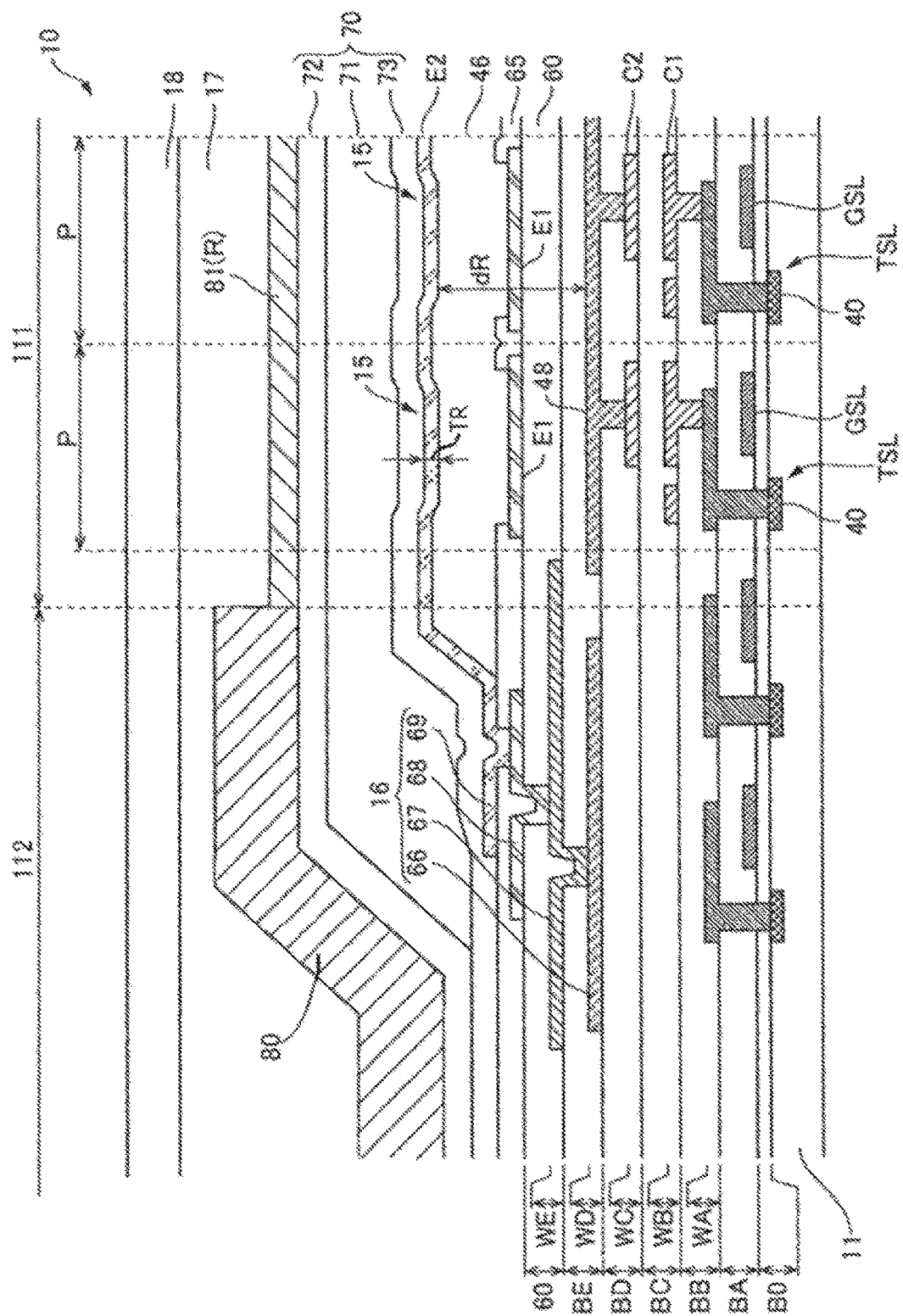
FIG. 8 is a cross-sectional view of the first panel illustrated in FIG. 1.

FIG. 8 is a cross-sectional view of the first panel 10 illustrated in FIG. 1. Note that, in the following, for convenience of explanation, an upper side in FIG. 8 is referred to as a "top" and a lower side is referred to as a "bottom".

As illustrated in FIG. 8, a transistor active region 40 (a source/drain region) for, for example, the selection transistor TSL of the pixel P, is formed at the first substrate 11, and an upper surface of the active region 40 is covered by an insulating film BO (a gate insulating film). A gate electrode GSL is formed at an upper surface of the insulating film BO. A multilayer wiring layer, in which a plurality of insulating layers BA to BE and a plurality of wiring layers WA to WE are alternately laminated, is formed at an upper layer side of the gate electrode GSL. Each of the wiring layers is formed of a low-resistance conductive material that contains aluminum, silver, or the like. The wiring layer WA that includes the scanning lines 62 and the like illustrated in FIG. 7 is formed at an upper surface of the insulating layer BA. The wiring layer WB that includes the signal lines 61, the first electrodes C1 and the like illustrated in FIG. 7 is formed at an upper layer of the insulating layer BB. The wiring layer WC that includes the second electrodes C2 and the like illustrated in FIG. 7 is formed at a surface layer of the insulating layer BC. The wiring layer WD that includes the first power supply conductors 48 and the like illustrated in FIG. 7 is formed at a surface layer of the insulating layer BD. The wiring layer WE that includes wiring 69, wiring 67 and the like is formed at an upper layer of the insulating layer BE. Note that, in the present exemplary embodiment, a support substrate in the image display device 1 is constituted by the first substrate 11, the insulating film BO, the gate electrode GSL, the insulating layers BA to BD, and the wiring layers WA to WC.

Here, in the first display region 111, an optical adjusting layer 60 is formed at the upper layer of the insulating layer BE. The optical adjusting layer 60 or a light path adjusting layer is an element used to set a resonance wavelength of an optical resonator to an adequate wavelength, and is formed of a light-transmissive insulating material such as silicon nitride, silicon dioxide or the like. Specifically, in the present exemplary embodiment, the first power supply conductor 48 as a reflection film, the insulating layer BE, the optical adjusting layer 60, the first electrode E1 as a transparent electrode, the light emission functional layer 46 including the light-emitting layer, and the second electrode E2 as a semi-reflective semi-transmissive electrode configure an optical resonator or micro resonator, and a light path length dR (optical distance) between an upper surface of the first power supply conductor 48 and a lower surface of the second electrode E2 in the optical resonator is adjusted in accordance with a film thickness of the optical adjusting layer 60 and the first electrode E1. Accordingly, in the first panel 10, the red light is extracted from a side of the second electrode E2 to set a resonant wavelength in light emitted from the first panel 10. Note that, in the present exemplary embodiment, since the first image light LR being the red light is emitted from the first panel 10, the light path length dR of the optical resonator is set to a value or distance appropriate for the first image light LR being the red color. In the first panel 10, the red light is extracted from the side of the second electrode E2, and thus the first light-emitting device 15 of a top-emission type is configured.

More specifically, the first electrode E1 is formed at an upper surface of the optical adjusting layer 60, for each of the pixels P in the first display region 111. The first electrode E1 constitutes the transparent electrode, and is formed of a light-transmissive conductive material such as ITO (indium tin complex oxide) or IZO (indium zinc complex oxide). An insulating pixel defining layer 65 is formed around the first electrode E1. The light emission functional layer 46 is formed at an upper surface of the first electrode E1. The light emission functional layer 46 is configured with an organic layer including the light-emitting layer formed by containing an organic EL material that emits red color light, and radiates or emits the red light as a result of supply of current. Note that, the light emission functional layer 46 may be configured with a laminate in which a transport layer or an injection layer of electrons or positive holes supplied to the light-emitting layer is provided. The light emission functional layer 46 is formed continuously over the plurality of pixels P in the first display region 111 in the present exemplary embodiment.

The second electrode E2 as the semi-reflective semi-transmissive electrode is formed at an upper layer of the light emission functional layer 46, over an entire area of the first display region 111, and, of the light emission functional layer 46, a region (a light-emitting region) sandwiched between the first electrode E1 and the second electrode E2 emits light. Then, the second electrode E2 also functions as the semi-reflective semi-transmissive layer that transmits some of the light that has reached it, and reflects back the rest of the light. More specifically, by forming a sufficiently thin film thickness using a photoreflective conductive material, such as an MgAg alloy as alloy containing silver or magnesium, as a main material, the second electrode E2 as the semi-reflective semi-transmissive electrode having semi-reflectivity and semi-transmittivity is formed. Thus, radiated light from the light emission functional layer 46 reciprocates between the upper surface of the first power supply conductor 48 as the reflection film, and the lower surface of the second electrode E2 as the semi-reflective semi-transmissive electrode, and as a result, the first image light LR being the red light being components of a particular resonance wavelength is selectively amplified. Then, the reciprocating light passes through the second electrode E2 and is emitted to an observation side (an opposite side to the first substrate 11). In other words, the first power supply conductor 48, the insulating layer BE, the optical adjusting layer 60, the first electrode E1, the light emission functional layer 46 including the light-emitting layer, and the second electrode E2 form the optical resonator that causes the light emitted from the light emission functional layer 46 to resonate between the first power supply conductor 48 that functions as the reflection film and the second electrode E2 that functions as the semi-reflective semi-transmissive electrode.

Note that, in the present disclosure, it is sufficient that the optical adjusting layer 60 is constituted by a light-transmissive insulating material such as silicon nitride or silicon dioxide, and the optical adjusting layer 60 may be a single layer body containing these materials or may be a laminate. Furthermore, when the optical adjusting layer 60 is constituted by a laminate, the insulating layer BE and the optical adjusting layer 60, including the insulating layer BE, may also be referred to as an optical adjusting layer.

Further, in the peripheral area 112, a metal wiring 16 including a plurality of wirings 66, 67, 68, 69, and the like is formed in the same layers as conductive layers formed in the first display region 111, and the wirings 66, 67, 68, and 69 are electrically coupled via contact holes of the insulating layers formed between the wirings, for example.

A sealing body 70 is formed at an upper layer side of the second electrode E2, over the entire area of the first substrate 11. The sealing body 70 is a light-transmissive film body that seals each of elements formed at the first substrate 11 and prevents infiltration of outside air and moisture, and in the present exemplary embodiment, is configured by a laminated film of a first sealing layer 71, a second sealing layer 72, and a third sealing layer 73. The third sealing layer 73 is formed at the upper layer of the second electrode E2 and is in direct contact with an upper surface of the second electrode E2. The third sealing layer 73 is an insulating inorganic material such as a silicon compound (typically, silicon nitride or silicon oxide), for example. Further, the first sealing layer 71 functions as a flattening film that buries level differences of the surface of the second electrode E2 and the third sealing layer 73. The first sealing layer 71 is formed of a light-transmissive organic material, such as an epoxy resin, for example. Further, the second sealing layer 72 is formed over the entire area of the first substrate 11. The second sealing layer 72 is formed of a silicon nitride compound, a silicon oxide compound, or the like, for example, which offers excellent water-resistant and heat-resistant properties.

The first coloring layer 81(R) is formed at an upper surface of the sealing body 70 (second sealing layer 72) in the first display region 111, and a shielding layer 80 is formed in the peripheral area 112. Thus, the red light in the red region is allowed to be transmitted by the first coloring layer 81(R) in the first display region 111, and the red light in the red region is blocked by the shielding layer 80 in the peripheral area 112.

Further, in the first panel 10, a transmissive cover substrate 18 is fixed on the opposite side to the first substrate 11, with respect to the first coloring layer 81(R) and the shielding layer 80, by an adhesive 17. Accordingly, the first coloring layer 81(R) and the shielding layer 80 are protected by the cover substrate 18.

In addition, in the first panel 10 having such a configuration, the first light-emitting device 15 is, in the present exemplary embodiment, as described above, constituted by the organic EL element in which the light emission functional layer 46 including the light-emitting layer of the organic EL material is interposed between the first electrode E1 (anode) and the second electrode E2 (cathode), and the light emission functional layer 46 is constituted by a laminate in which a positive hole transport layer, the light-emitting layer (red light-emitting layer), an electron transport layer, and an electron injecting layer are laminated in this order from a side of the first electrode E1 (anode), for example, and each layer constituting the first light-emitting device 15 will be described below.

First Electrode E1 (ANODE)

The first electrode E1 (anode) is an electrode that injects a positive hole into the positive hole transport layer. A material having a large work function and excellent conductivity may be used as a constituent material of the first electrode E1.

Examples of the constituent materials of the first electrode E1 include, for example, oxides such as ITO (Indium Tin Oxide), IZO (Indium Zinc Oxide), $In_3O_3$, $SnO_2$, Sb containing $SnO_2$, and Al containing ZnO, Au, Pt, Ag, Cu, or alloy including these, and the like, and one or two or more types thereof can be used in combination.

An average thickness of the first electrode E1 is not particularly limited, but may be approximately from 10 nm to 200 nm, more preferably, may be approximately from 50 nm to 150 nm.

Second Electrode E2 (Cathode)

The second electrode E2 (cathode) is an electrode that injects electrons into the electron transport layer via the electron injecting layer. A material having a small work function may be used as a constituent material of the second electrode E2.

Examples of the constituent material of the second electrode E2 include, for example, Li, Mg, Ca, Sr, La, Ce, Er, Eu, Sc, Y, Yb, Ag, Cu, Al, Cs, Rb, or alloy including these, and one or two or more types thereof can be used in combination (for example, a laminate of a plurality of layers or the like).

Positive Hole Transport Layer

The positive hole transport layer functions to transport a positive hole injected from the first electrode E1 (anode) to the light-emitting layer.

A constituent material of the positive hole transport layer is not particularly limited, but examples thereof include amine-based compounds such as N,N,N',N'-tetraphenylbenzidine, and derivatives thereof, and one or two or more types thereof can be used in combination.

Light-Emitting Layer (Red Light-Emitting Layer)

The light-emitting layer is constituted by the red light-emitting layer that emits the red light, in the first light-emitting device 15, and is constituted to include, for example, a red light-emitting material that emits the red light, and a host material that holds the red light-emitting material.

The red light-emitting material is not particularly limited, and one or two or more types of various red fluorescent materials and red phosphorescent materials can be used in combination.

The red fluorescent material is not limited as far as the material emits red fluorescence, and for example, perylene derivatives such as tetraaryldiindenoperylene derivatives, europium complexes, benzopyran derivatives, rhodamine derivatives, benzothioxanthene derivatives, porphyrin derivatives, nile red, 4-(dicyanomethylene)-2-tert-butyl-6-(1,1,7,7-tetramethyljulolidin-4-yl-vinyl)-4H-pyran (DCJTB), (E)-2-(2-(4-(dimethylamino)styryl)-6-methyl-4H-pyran-4-ylidene)malononitrile (DCM), or the like may be exemplified.

The red phosphorescent material is not particularly limited and may include any materials that emit red phosphorescence light, such as complexes of metals such as iridium, ruthenium, platinum, osmium, rhenium, and palladium, for example. The metals complexes may have at least one ligand having a phenylpyridine backbone, bipyridyl backbone, porphyrin backbone, or the like. More specifically, examples include tris(1-Phenylisoquinoline)iridium, bis(2-benzo[b]thiophen-2-yl-pyridine) (acetylacetonate)iridium(III) (Ir(btp)$_2$(acac)), 2,3,7,8,12,13,17,18-octaethyl-21H,23H-porphine platinum (PtOEP).

The host material is not particularly limited as long as the host material exhibits the aforementioned function with respect to a red light-emitting material used, but when the red light-emitting material includes a red fluorescent material, examples include for example, anthracene derivatives as illustrated in Formula (4) below, anthracene derivatives such as 3-tert-butyl-9,10-di(naphth-2-yl)anthracene (TBADN), acene derivatives (acene-based compound) such as tetracene derivatives as illustrated in Formula (7) below, distyrylarylene derivatives, perylene derivatives, distyrylbenzene derivatives, distyrylamine derivatives, quinolinolato-based metal complexes such as tris(8-quinolinolato) aluminum complex (Alq$_3$), triarylamine derivatives such as tetramer of triphenylamine, oxadiazole derivatives, silole derivatives, dicarbazole derivatives, oligothiophene derivatives, benzopyran derivatives, triazole derivatives, benzoxazol derivatives, benzothiazole derivatives, quinoline derivatives, 4,4'-bis(2,2-diphenylvinyl)biphenyl (DPVBi), and the like, and one of these can be used alone or two or more types thereof can be used in combination.

Chemical Formula 1

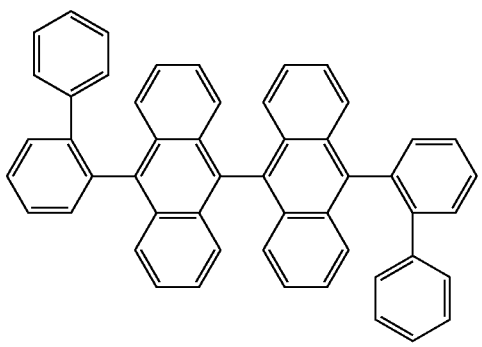

(4)

Chemical Formula 2

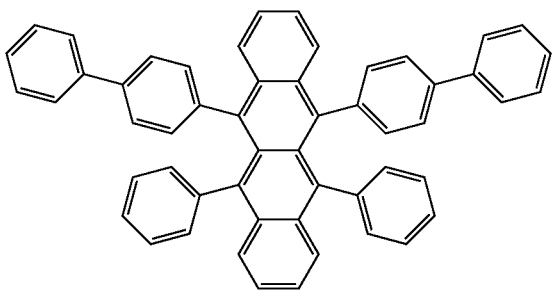

(7)

In addition, when the red light-emitting material includes the red phosphorescent material, examples of the host material include, for example, carbazole derivatives such as 4,4'-bis(carbazol-9-yl)biphenyl (CBP), and the like, and one of these can be used alone or two or more types thereof can be used in combination.

Electron Transport Layer

The electron transport layer functions to transport electrons injected from the second electrode E2 (cathode) via the electron injecting layer to the light-emitting layer.

For constituent materials of the electron transport layer (electron transport materials), phenanthroline derivatives such as 2,9-dimethyl-4,7-diphenyl-1,10-phenanthroline (BCP), quinoline derivatives such as organometallic complexes with 8-quinolinol or derivatives thereof as ligands (for example, tris(8-hydroxy-quinolinato)aluminium (Alq$_3$)), azaindolizine derivatives, oxadiazole derivatives, perylene derivatives, pyridine derivatives, pyrimidine derivatives, quinoxaline derivatives, diphenylquinone derivatives, nitro-substituted fluorene derivatives, or the like are exemplified, and one or two or more types thereof can be used in combination.

Electron Injecting Layer

The electron injecting layer functions to improve efficiency of electron injection from the second electrode E2 (cathode).

Examples of a constituent material (electron injecting material) of the electron injecting layer include, for example, various types of inorganic insulating materials and various types of inorganic semiconductor materials.

Examples of such inorganic insulating materials include, for example, alkali metal chalcogenides (oxides, sulfides, selenides, tellurides), alkaline earth metal chalcogenides, alkali metal halides, alkaline earth metal halides, and the like, and one or two or more types thereof can be used in combination. By configuring the electron injecting layer with these as main materials, electron injection properties can be further improved. In particular, the alkali metal compound (alkali metal chalcogenide, alkali metal halide, or the like) has a very small work function, and by using this to configure the electron injecting layer, high luminance can be achieved for the light-emitting device.

Examples of the alkali metal chalcogenide include, for example, Li$_2$O, LiO, Na$_2$S, Na$_2$Se, NaO, and the like.

Examples of the alkaline earth metal chalcogenide include, for example, CaO, BaO, SrO, BeO, BaS, MgO, CaSe, and the like.

Examples of the alkali metal halide include, for example, CsF, LiF, NaF, KF, LiCl, KCl, NaCl, and the like.

Examples of the alkali earth metal halide include, for example, $CaF_2$, $BaF_2$, $SrF_2$, $MgF_2$, $BeF_2$, and the like.

Examples of the inorganic semiconductor materials include, for example, oxides, nitrides, or oxynitrides containing at least one element of Li, Na, Ba, Ca, Sr, Yb, Al, Ga, In, Cd, Mg, Si, Ta, Sb, and Zn, and one or two or more types thereof can be used in combination.

Configurations of Second Panel 20 and Third Panel 30

Figure 9:
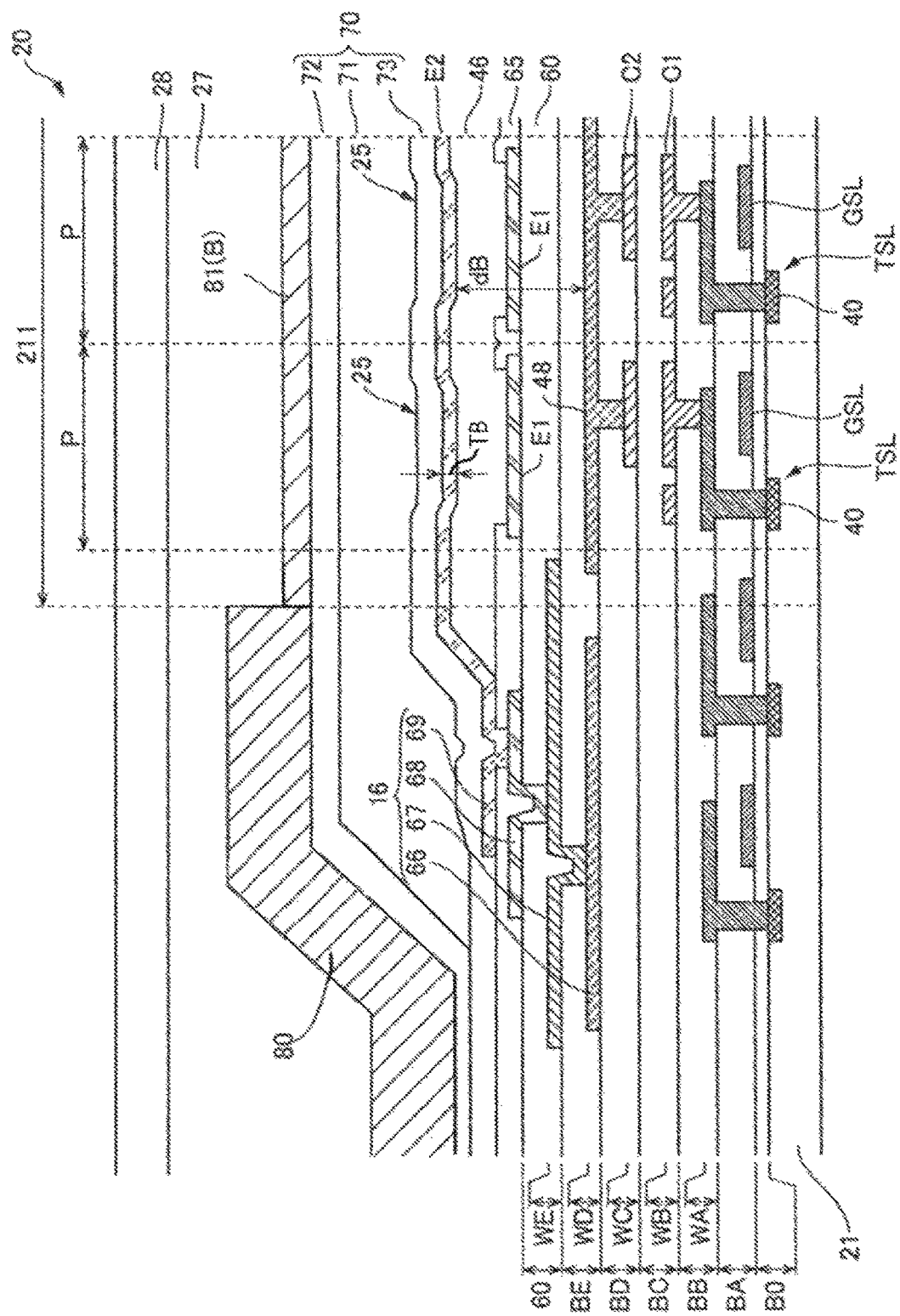
FIG. 9 is a cross-sectional view of a second panel illustrated in FIG. 1.
Figure 10:
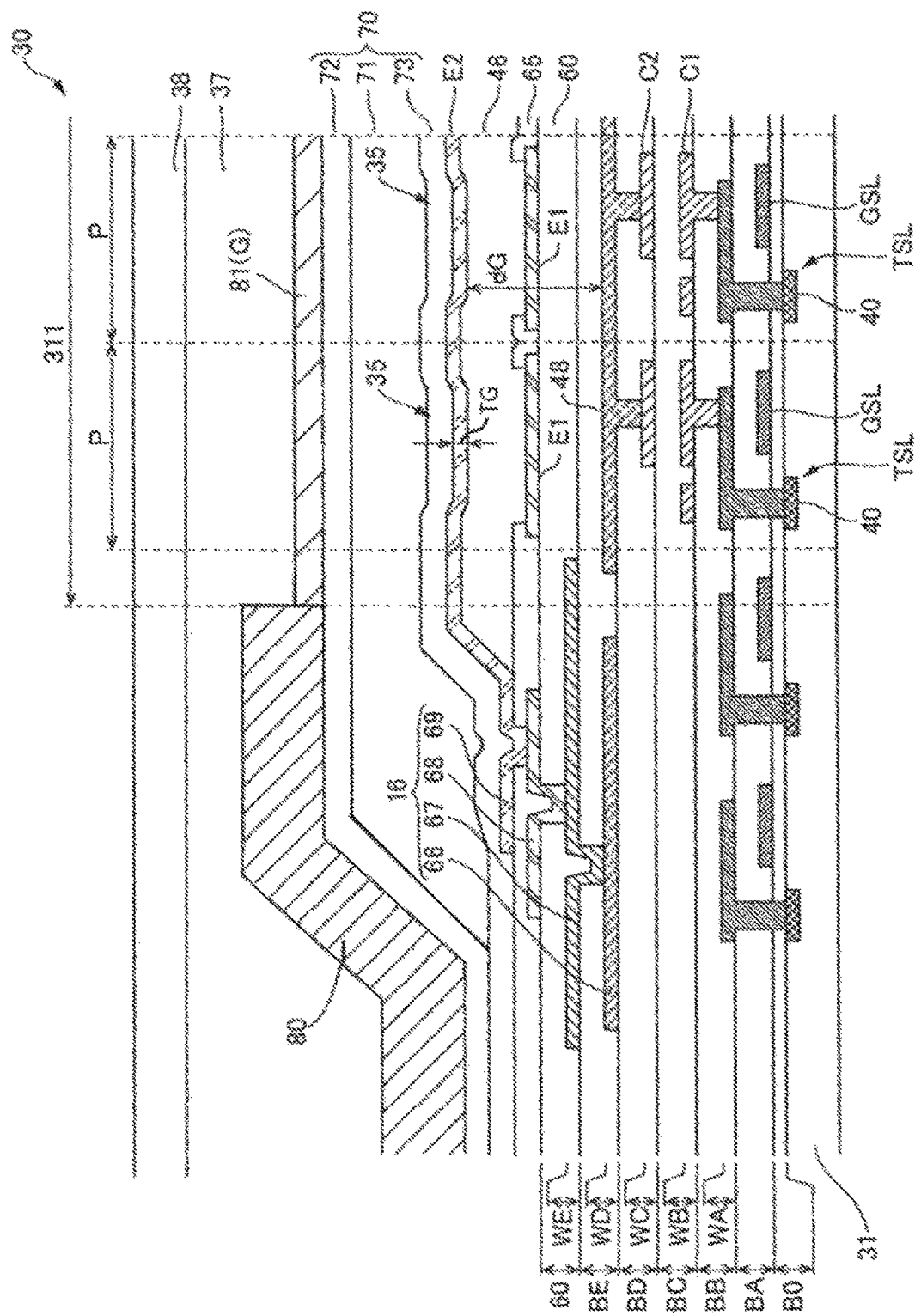
FIG. 10 is a cross-sectional view of a third panel illustrated in FIG. 1.

FIG. 9 is a cross-sectional view of the second panel 20 illustrated in FIG. 1, and FIG. 10 is a cross-sectional view of the third panel 30 illustrated in FIG. 1. Note that, in the following, for convenience of explanation, an upper side in each of FIG. 9 and FIG. 10 will be referred to as a "top" and a lower side as a "bottom".

Similar to the first panel 10, the second panel 20 and the third panel 30 illustrated in FIG. 1 have the electrical configuration illustrated in FIG. 6 and FIG. 7, and as illustrated in FIG. 9 and FIG. 10, instead of the plurality of first light-emitting devices 15, the second panel 20 includes the light emission functional layer 46 constituted by an organic layer including the light-emitting layer (blue light-emitting layer) formed by containing an organic EL material for emitting the blue light to include the plurality of second light-emitting devices 25 that emit the blue color image light, the third panel 30 includes the light emission functional layer 46 constituted by an organic layer including the light-emitting layer (green light-emitting layer) formed by containing an organic EL material for emitting the green light to include the plurality of third light-emitting devices 35 that emit the green color image light.

Each of the light-emitting layer (blue light-emitting layer) included in the light emission functional layer 46 included in the second light-emitting device 25, and the light-emitting layer (green light-emitting layer) included in the light emission functional layer 46 included in the third light-emitting device 35 is configured, for example, as follows.

Blue Light-Emitting Layer

The blue light-emitting layer is configured to contain a blue light-emitting material that emits the blue light, and a host material that holds the blue light-emitting material.

The blue light-emitting material is not particularly limited, and one or two or more types of various blue fluorescent materials and blue phosphorescent materials can be used in combination.

The blue fluorescent material is not particularly limited as long as the material emits blue fluorescence, and for example, examples include distyrylamine derivatives such as distyryldiamine compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[{9,9-dioctylfluorenyl-2,7-diyl}-co-{1,4-(2,5-dimethoxy)benzene}], poly[{9,9-dihexyloxyfluorene-2,7-diyl}-ortho-co-(2-methoxy-5-{2-ethoxyhexyloxy}phenylene-1,4-diyl], poly[{9,9-dioctylfluorenyl-2,7-diyl}-co-{ethynylbenzene}], or the like, and one of these can be used alone or two or more types thereof can be used in combination.

The blue phosphorescence material is not particularly limited and may include any materials that emit blue phosphorescence light, such as complexes of metals such as iridium, ruthenium, platinum, osmium, rhenium, and palladium, for example. More specifically, examples include bis[2-(4,6-difluorophenyl)pyridinato-N,C2'](picolinate) iridium(III) (Firpic), tris[2-(4,6-difluorophenyl)pyridinato-N,C2')]iridium(III) (Ir(Fppy)$_3$), bis[2-(3,5-trifluorometyl)pyridinato-N,C2'](picolinate)iridium(III), Bis[2-(4,6-difluorophenyl)pyridinato-N,C2'](acetylacetonate)iridium (III).

As the host material, a host material similar to that described as the host material of the red light-emitting layer can be used, but of these, an acene-based compound may be used.

Green Light-Emitting Layer

The green light-emitting layer is configured to include a green light-emitting material that emits the green light, and a host material (third host material) that holds the green light-emitting material.

The green light-emitting material is not particularly limited, and one or two or more types of various green fluorescent materials and green phosphorescent materials can be used in combination.

The green fluorescent material is not particularly limited as long as the material emits green fluorescence, and for example, examples include coumarin derivatives, quinacridones and derivatives thereof such as quinacridone derivatives, 9,10-bis[9-ethyl-3-carbazoyl)-vinylenyl)]-anthracene, poly(9,9-dihexyl-2,7-vinylenefluorene), poly[(9,9-dioctylfluorene-2,7-diyl)-co-(1,4-diphenylene-vinylene-2-methoxy-5-(2-ethylhexyloxy)benzen)], poly[(9,9-dioctyl-2,7-divinylenefluorene)-ortho-co-(2-methoxy-5-(2-ethoxyloxy-1,4-phenylene)], or the like, and one of these can be used alone or two or more types thereof can be used in combination.

The green phosphorescent material is not particularly limited and may include, for example, any materials that emit green phosphorescence light, such as complexes of metals such as iridium, ruthenium, platinum, osmium, rhenium, and palladium, for example. Among those, the metal complexes having at least one ligand having a phenylpyridine backbone, bipyridyl backbone, porphyrin backbone, or the like may be used. More specifically, examples include tris(2-phenylpyridinato)iridium(III) (Ir(ppy)$_3$), bis(2-phenylpyridine) (acetylacetonate)iridium(III) (Ir(ppy)$_2$(acac)), tris{5-fluoro-2-[5-(trifluoromethyl)-2-pyridinyl]phenyl}iridium.

As the host material, a host material similar to that described as the host material of the red light-emitting layer can be used, but of these, an acene-based compound may be used.

As illustrated in FIG. 9, in the second panel 20, in place of the first coloring layer 81(R) explained with reference to FIG. 8, the second coloring layer 81(B) is formed, and the second coloring layer 81(B) selectively allows the blue light in the blue region to transmit. Further, a film thickness of the optical adjusting layer 60 and the first electrode E1 illustrated in FIG. 9 is adjusted to correspond to a wavelength of the second image light LB being the blue color emitted from the second panel 20, and in an optical resonator, a light path length dB (optical distance) between the upper surface of the first power supply conductor 48 functioning as the reflection film and the lower surface of the second electrode E2 functioning as the semi-reflective semi-transmissive electrode is optimized. Further, in the second panel 20, a transmissive cover substrate 28 is fixed, with respect to the second coloring layer 81(B), on the opposite side to the second substrate 21, by an adhesive 27.

Further, as illustrated in FIG. 10, in the third panel 30, in place of the first coloring layer 81(R) explained with reference to FIG. 8, the third coloring layer 81(G) is formed, and the third coloring layer 81(G) selectively allows the green light in the green region to transmit. Further, a film thickness of the optical adjusting layer 60 and the first electrode E1 illustrated in FIG. 10 is adjusted to correspond to a wavelength of the third image light LG being the green color emitted from the third panel 30, and in an optical resonator, a light path length dG (optical distance) between the upper surface of the first power supply conductor 48 functioning as the reflection film and the lower surface of the second electrode E2 functioning as the semi-reflective semi-transmissive electrode is optimized. Further, in the third panel 30, a transmissive cover substrate 38 is fixed, with respect to the third coloring layer 81(G), on the opposite side to the third substrate 31, by an adhesive 37.

In the image display device 1 described above, in the present exemplary embodiment, as described above, in the first panel 10, a film thickness of the optical adjusting layer 60 and the first electrode E1 included in the plurality of first light-emitting devices 15 is adjusted so as to correspond to a wavelength of the first image light LR being the red color. In addition, in the second panel 20, the film thickness of the optical adjusting layer 60 and the first electrode E1 included in the plurality of second light-emitting devices 25 is adjusted so as to correspond to the wavelength of the second image light LB being the blue color. In addition, in the third panel 30, the film thicknesses of the optical adjusting layer 60 and the first electrode E1 included in the plurality of third light-emitting devices 35 is adjusted so as to correspond to the wavelength of the third image light LG being the green color. In this manner, wavelength ranges of image light to be emitted from the plurality of first light-emitting devices 15, the plurality of second light-emitting devices 25, and the plurality of third light-emitting devices 35 are different. Thus, at least one of respective sums of the thickness of the optical adjusting layer 60 and the thickness of the first electrode E1 in the plurality of first light-emitting devices 15, the plurality of second light-emitting devices 25, and the plurality of third light-emitting devices 35 is different from others. In other words, at least one of the sum of the thickness of the optical adjusting layer 60 and the thickness of the first electrode E1 in the plurality of first light-emitting devices 15, the sum of the thickness of the optical adjusting layer 60 and the thickness of the first electrode E1 in the plurality of second light-emitting devices 25, and the sum of the thickness of the optical adjusting layer 60 and the thickness of the first electrode E1 in the plurality of third light-emitting devices 35 is different from the others.

In this manner, a size of the film thicknesses of the optical adjusting layer 60 and the first electrode E1, in each of the plurality of first light-emitting devices 15, the plurality of second light-emitting devices 25, and the plurality of third light-emitting devices 35 is appropriately set, to optimize the light path length dR (optical distance) between the first power supply conductor 48 and the second electrode E2, in the optical resonator of the plurality of first light-emitting devices 15, so the first image light LR having the peak in the red region is reliably emitted. In addition, in the optical resonator of the plurality of second light-emitting devices 25, the light path length dB (optical distance) between the first power supply conductor 48 and the second electrode E2 is optimized, so the second image light LB having the peak in the blue region is reliably emitted. In addition, in the optical resonator of the plurality of third light-emitting devices 35, the light path length dG (optical distance) between the first power supply conductor 48 and the second electrode E2 is optimized, so the third image light LG having the peak in the green region is reliably emitted. In other words, the size of the film thicknesses of the optical adjusting layer 60 and the first electrode E1 in each of the plurality of first light-emitting devices 15, the plurality of second light-emitting devices 25, and the plurality of third light-emitting devices 35, is arbitrarily set, so that the light path length dR, the light path length dB, and the light path length dG between the first power supply conductor 48 and the second electrode E2 can be set to desired distances respectively, and the red first image light LR, the blue second image light LB, and the green third image light LG can be reliably emitted.

In addition, as described above, by adjusting the film thickness of the optical adjusting layer 60 and the first electrode E1, that is, the sum of the thickness of the optical adjusting layer 60 and the thickness of the first electrode E1, the light path lengths dR, dB, and dG between the first power supply conductor 48 and the second electrode E2 in the optical resonator are arbitrarily set. Thus, a thickness error of the light emission functional layers 46 or organic layers included in the first light-emitting device 15, the second light-emitting device 25, and the third light-emitting device 35, included in the first panel 10, the second panel 20, and the third panel 30 respectively, may be set to be equal to or less than ±20%, and more preferably may be set to be identical. Since the thickness error of the light emission functional layers 46 can be set to be less than or equal to the above upper limit value, drive voltages for driving the first light-emitting device 15, the second light-emitting device 25, and the third light-emitting device 35 respectively can be set to be approximately identical. Thus, the capacitance elements C being identical provided in the first panel 10, the second panel 20, and the third panel 30 respectively can be used without changing, and thus complication of a configuration of each of the first panel 10, the second panel 20, and the third panel 30 can be more reliably prevented. The light emission functional layers 46 or organic layers are included in the first light-emitting device 15, the second light-emitting device 25, and the third light-emitting device 35, respectively, and the thicknesses thereof can be set in accordance with light emission characteristics required for the first light-emitting device 15, the second light-emitting device 25, and the third light-emitting device 35, respectively. Accordingly, an increase in power consumption of the image display device 1 due to a higher drive voltage when driving each of the first light-emitting device 15, the second light-emitting device 25, and the third light-emitting device 35, and occurrence of a short-circuit in the light emission functional layer 46 can be more reliably prevented.

Furthermore, by adjusting the film thickness of the optical adjusting layer 60 and the first electrode E1, that is, the sum of the thickness of the optical adjusting layer 60 and the thickness of the first electrode E1, the sum of the thickness of the optical adjusting layer 60 and the thickness of the first electrode E1 may be set to be greater than the thickness of the light emission functional layer 46 or organic layer. In this manner, by adjusting the sum of the thickness of the optical adjusting layer 60 and the thickness of the first electrode E1 to adopt a configuration in which each of the light path lengths dR, dB, and dG between the first power supply conductor 48 and the second electrode E2 is set to a desired size, the thickness of the light emission functional layer 46 can be set to be smaller than the sum of the thickness of the optical adjusting layer 60 and the thickness of the first electrode E1, taking into account luminous efficiency of the light emission functional layer 46. Thus, each of the first light-emitting device 15, the second light-emitting device 25, and the third light-emitting device 35 can be constituted by a light-emitting device capable of low voltage driving.

In addition, when adjusting the film thickness of the optical adjusting layer 60 and the first electrode E1, that is, the sum of the thickness of the optical adjusting layer 60 and the thickness of the first electrode E1, the respective thicknesses of the first electrodes E1 included in the first light-emitting device 15, the second light-emitting device 25, and the third light-emitting device 35 may be identical, and the thicknesses of the first electrodes E1 may be smaller than the film thickness of the optical adjusting layer 60. In other words, the film thickness of the optical adjusting layer 60 may be greater than the film thickness of the first electrode E1. By satisfying this relationship between the film thicknesses, absorption of the image light LR, LB, or LG in the first electrode E1 can be appropriately suppressed. In addition, the respective drive voltages when driving the first light-emitting device 15, the second light-emitting device 25, and the third light-emitting device 35 can be relatively easily set to approximately identical magnitude.

Note that, as described above, it is sufficient that the optical adjusting layer 60 be formed from a light-transmissive insulating material such as silicon nitride or silicon dioxide, and the optical adjusting layer 60 may be a single layer body containing these, or may be a laminate. When the optical adjusting layer 60 is constituted by a laminate, the insulating layer BE and the optical adjusting layer 60 can be referred to as an optical adjusting layer including the insulating layer BE. However, the optical adjusting layer may be constituted by a laminate of two or more layers. Accordingly, occurrence of strain in the panels 10, 20, or 30 due to occurrence of stress in the laminate formed of the insulating layer BE and the optical adjusting layer 60 can be appropriately suppressed or prevented.

In addition, when the first electrode E1 is constituted by ITO and the optical adjusting layer 60 is constituted by a single layer body, the optical adjusting layer 60 may be composed of silicon dioxide, and when the optical adjusting layer 60 is constituted by a laminate, a top layer of the optical adjusting layer 60 may be composed of silicon dioxide. Accordingly, wavelength dispersion of refractive index at an interface between the first electrode E1 and the optical adjusting layer 60 can be reduced, so it is possible to improve light extraction efficiency. Furthermore, when the optical adjusting layer 60 is constituted by a laminate, a top layer of the optical adjusting layer 60 may be constituted by silicon dioxide, and a lower layer of the top layer may be composed of silicon nitride. This allows, when depositing the top layer as patterned, the lower layer to function as an etching stop layer.

As described above, in the first panel 10, the light path length dR between the first power supply conductor 48 and the second electrode E2 is adjusted to an optimal size so that the first image light LR has the peak in the red region. In addition, in the second panel 20, the light path length dB between the first power supply conductor 48 and the second electrode E2 is adjusted to an optimal size so that the second image light LB has the peak in the blue region. In addition, in the third panel 30, the light path length dG between the first power supply conductor 48 and the second electrode E2 is adjusted to an optimal size so that the third image light LG has the peak in the green region.

As described above, in the respective panels 10, 20, and 30, the light path lengths dR, dB, and dG between the first power supply conductor 48 and the second electrode E2 are adjusted to the optimal sizes respectively. Thus the first image light LR having the peak in the red region for which a wavelength region is optimized between the first power supply conductor 48 and the second electrode E2 is generated in the first panel 10, the second image light LB having the peak in the blue region is generated in the second panel 20, and the third image light LG having the peak in the green region is generated in the third panel 30.

Then, in the panels 10, 20, and 30, the image light LR, LB, and LG optimized in this manner are required to be extracted from sides of the second electrode E2 respectively, to achieve excellent color purity and excellent light emission luminance in a compatible manner.

However, when considering extraction of light by transmitting the light through the second electrode E2 being the cathode having a certain film thickness, the color purity and the light emission luminance have a trade-off relationship. In other words, there is a relationship in which, when a film thickness of the second electrode E2 is reduced, excellent light emission luminance can be obtained, but color purity tends to decrease, and compared to this, when the film thickness of the second electrode E2 is increased, excellent color purity can be obtained, but light emission luminance tends to decrease.

Here, in recent years, BT.2020 standards are presented, in which color purity or color gamut is defined by a region surrounded by three points on a CIE1931-xy chromaticity diagram (Red (0.708, 0.292), Green (0.170, 0.797), Blue (0.131, 0.046)). These BT.2020 standards are standards in which 99.9% of colors present in nature are reproduced. Thus, when an area of the region surrounded by the above-described three points is defined as 100%, the first image light LR having the peak in the red region, the second image light LB having the peak in the blue region, and the third image light LG having the peak in the green region, emitted from the respective panels 10, 20, and 30, are permuted onto chromaticity coordinates, and a percentage (%) of an area overlapping with the area surrounded by Red, Green, and Blue is defined as a "BT.2020 coverage", it can be said that when the BT.2020 coverage is high, the colors present in nature are reproduced. That is, it can be said that the image light LR, LB, and LG are extracted from the panels 10, 20, and 30, respectively, with excellent color purity, from the side of the second electrode E2.

Under the circumstances described above, extraction of the image light LR, LB, and LG, from the panels 10, 20, and 30, respectively, from the side of the second electrode E2, with a high BT.2020 coverage (%), while excellent light emission luminance is maintained, is considered.

Here, as described above, when the film thicknesses of the second electrodes E2 of the light-emitting devices 15, 25, and 35 included in the panels 10, 20, and 30 respectively are simply changed so as to have an identical thickness, the color purity or the BT.2020 coverage and the light emission luminance have a tradeoff relationship, and thus both the high BT.2020 coverage and the excellent light emission luminance cannot be achieved in a compatible manner.

In the present disclosure, each of the panels 10, 20, and 30 is provided independently in the image display device 1, and the panels 10, 20, and 30 include the light-emitting devices 15, 25, and 35, respectively. Thus, it is possible to independently set the film thickness of the second electrode E2 included in each of the light-emitting devices 15, 25, and 35.

Thus, in the following, a consideration is given in which, each of a film thickness TR [nm] of the second electrode E2 included in the first light-emitting device 15, that is, a first cathode, and a film thickness TB [nm] of the second electrode E2 included in the second light-emitting device 25, that is, a second cathode, and a film thickness TG [nm] of the second electrode E2 included in the third light-emitting device 35, that is, a third cathode is set independently, so as to achieve both the high BT.2020 coverage and the excellent light emission luminance in a compatible manner.

First, in the color gamut or CIE1931-xy chromaticity diagram, chromaticity coordinates of Green are dominant. This can be described from Equation (A) below for determining chromaticity coordinates (x, y).

Mathematical Equation 1
$$x = \frac{X}{X+Y+Z}, y = \frac{Y}{X+Y+Z} \quad (A)$$

In this Equation (A), of tristimulus values "X", "Y", and "Z", "Y" corresponds to "luminance". Additionally, Green is known to be a region in which visibility is high. Thus, fluctuation in the film thickness TG of the second electrode E2 or third cathode, that is, fluctuation in a half width in a light emission spectrum of the third image light LG greatly changes luminance. Thus, the chromaticity coordinates (x, y) are more likely to move compared to Red and Blue.

Also, the chromaticity coordinates (x, y) of Green in BT.2020 standards are (0.170, 0.797) as described above. Since color purity is very high for the coordinates, the half width of the light emission spectrum that is as narrow as possible is suitable in order to satisfy this. However, in the third panel 30 including the third light-emitting device 35 constituted by an organic EL element, narrowing the half width leads to a reduction in light emission luminance. Thus, it is substantially difficult to maintain a small amount of displacement from the chromaticity coordinates (x, y), and excellent light emission luminance, by only Green.

Compared to this, for the chromaticity coordinates (x, y) of each of Red and Blue in BT.2020 standards, an amount of displacement due to film thickness fluctuation in the second electrode E2 is small, compared to the chromaticity coordinates (x, y) of Green, and a tendency for this amount of displacement to decrease is greater for the chromaticity coordinates (x, y) of Red, when comparing the chromaticity coordinates (x, y) of Red and the chromaticity coordinates (x, y) of Blue.

Thus, in the present disclosure, the film thickness TR of the second electrode E2 included in the first light-emitting device 15, that is, the first cathode, is set to be smaller than the film thickness TG [nm] of the second electrode E2 included in the third light-emitting device 35, that is, the third cathode. In other words, the thickness of the first cathode and the thickness of the third cathode may be defined so as to satisfy a relationship TR<TG, and preferably a relationship 1.2<TG/TR<5.0. By satisfying such a relationship and efficiently obtaining the light emission luminance by the first panel 10 or the first light-emitting device 15, the light emission luminance of the image display device 1 as a whole can be increased while maintaining the high BT.2020 coverage.

The film thickness TB of the second electrode E2 included in the second light-emitting device 25, that is, the second cathode may be set to be smaller than the film thickness TG of the second electrode E2 included in the third light-emitting device 35, that is, third cathode, or may be set to a thickness identical to the film thickness TG of the third cathode. In other words, the thickness of the second cathode and the thickness of the third cathode may be defined so as to satisfy a relationship TB≤TG, and preferably a relationship 1.1<TG/TB<3.0. In this way, by setting the film thickness TB to be smaller than the film thickness TG or to be identical to the film thickness TG, to efficiently obtain light emission luminance by the second panel 20 or the second light-emitting device 25, the light emission luminance of the image display device 1 as a whole can be further increased, while maintaining the high BT.2020 coverage.

The film thickness TR of the second electrode E2 included in the first light-emitting device 15, that is, the first cathode may be set to be smaller than the film thickness TB of the second electrode E2 included in the second light-emitting device 25, that is, the second cathode, or may be set to a thickness identical to the film thickness TB of the second cathode. In other words, the thickness of the first cathode and the thickness of the second cathode may be defined so as to satisfy a relationship TR TB. In this way, by setting the film thickness TR to be smaller than the film thickness TB or to be identical to the film thickness TB, to efficiently obtain light emission luminance by the first panel 10 or the first light-emitting device 15, the light emission luminance of the image display device 1 as a whole can be further increased, while maintaining the high BT.2020 coverage.

When the film thickness TR of the first cathode, the film thickness TB of the second cathode, and the film thickness TG of the third cathode satisfy the relationships described above, each of the film thickness TR of the first cathode, the film thickness TB of the second cathode, and the film thickness TG of the third cathode may be from 10 nm to 40 nm. When each of the cathode film thicknesses TR, TB, and TG is less than 10 nm, there is a possibility that, due to the cathode being formed in an island shape, optical characteristics as the semi-reflective semi-transmissive film and, in addition, electron injection characteristics as the cathode may not be imparted to the cathode. In addition, when each of the cathode film thicknesses TR, TB, and TG is greater than 40 nm, there is a possibility that it tends to be difficult for light to transmit the semi-reflective semi-transmissive film, and sufficient light emission luminance may not be obtained by each of the panels 10, 20, and 30. Furthermore, in this case, the film thickness TG of the third cathode, more preferably, may be from 25 nm to 40 nm. Accordingly, the relationship TR<TG and, in addition, the relationship TB≤TG can be relatively easily satisfied, and an effect obtained by satisfying the relationship TR<TG and, in addition, the relationship TB≤TG, can be more significantly exhibited.

As described above, each of the second electrode E2 included in the first light-emitting device 15, that is, the first cathode, the second electrode E2 included in the second light-emitting device 25, that is, the second cathode, and the second electrode E2 included in the third light-emitting device 35, that is, the third cathode, is configured, in the present exemplary embodiment, with an MgAg alloy as alloy containing silver or magnesium as a main material. Furthermore, a ratio of Mg to Ag (Mg:Ag) in the MgAg alloy may be from 1:7 to 1:13, or more preferably may be 1:10. Accordingly, the second electrodes E2 included in the respective light-emitting devices 15, 25, and 35 can be reliably provided with a function as the semi-reflective semi-transmissive electrode, and can be caused to more significantly exhibit the effect when the relationship TR<TG, the relationship TB≤TG, in addition, the relationship TR TB are satisfied.

In addition, the BT.2020 coverages by the first image light LR, the second image light LB, and the third image light LG emitted from the respective panels 10, 20, and 30 as described above may be, specifically, not smaller than 87.0%, and more preferably may be not smaller than 89.0%. When the BT.2020 coverage is not smaller than the above-described lower limit, it can be said that each of the first image light LR, the second image light LB, and the third image light LG is extracted from the second electrode E2 with excellent color purity.

Note that, in the present exemplary embodiment, the case is described in which, in the first panel 10, the red light is emitted from the first light-emitting device 15, in the second panel 20, the blue light is emitted from the second light-emitting device 25, and in the third panel 30, the green light is emitted from the third light-emitting device 35, the image light in wavelength regions are transmitted by the first coloring layer 81(R), the second coloring layer 81(B), and the third coloring layer 81(G), respectively, and each of the first panel 10, the second panel 20, and the third panel 30 includes the optical resonator and the coloring layer. But the present disclosure is not limited to such a case, for example, for the first panel 10, the second panel 20, and the third panel 30, formation of the coloring layer may be omitted. Each of the first light-emitting device 15, the second light-emitting device 25, and the third light-emitting device 35 may emit white light.

In the present exemplary embodiment, the case is described in which the first panel 10, the second panel 20, and the third panel 30 include the cover substrate 18, the cover substrate 28, and the cover substrate 38, respectively, but formation of the cover substrate 18, the cover substrate 28, and the cover 38 may be omitted.

The image display device 1 described above can be incorporated into various virtual image display devices.

Eyeglass Display

Hereinafter, as an example of the virtual image display device of the present disclosure, an eyeglass display including the image display device 1 will be described.

Figure 11:
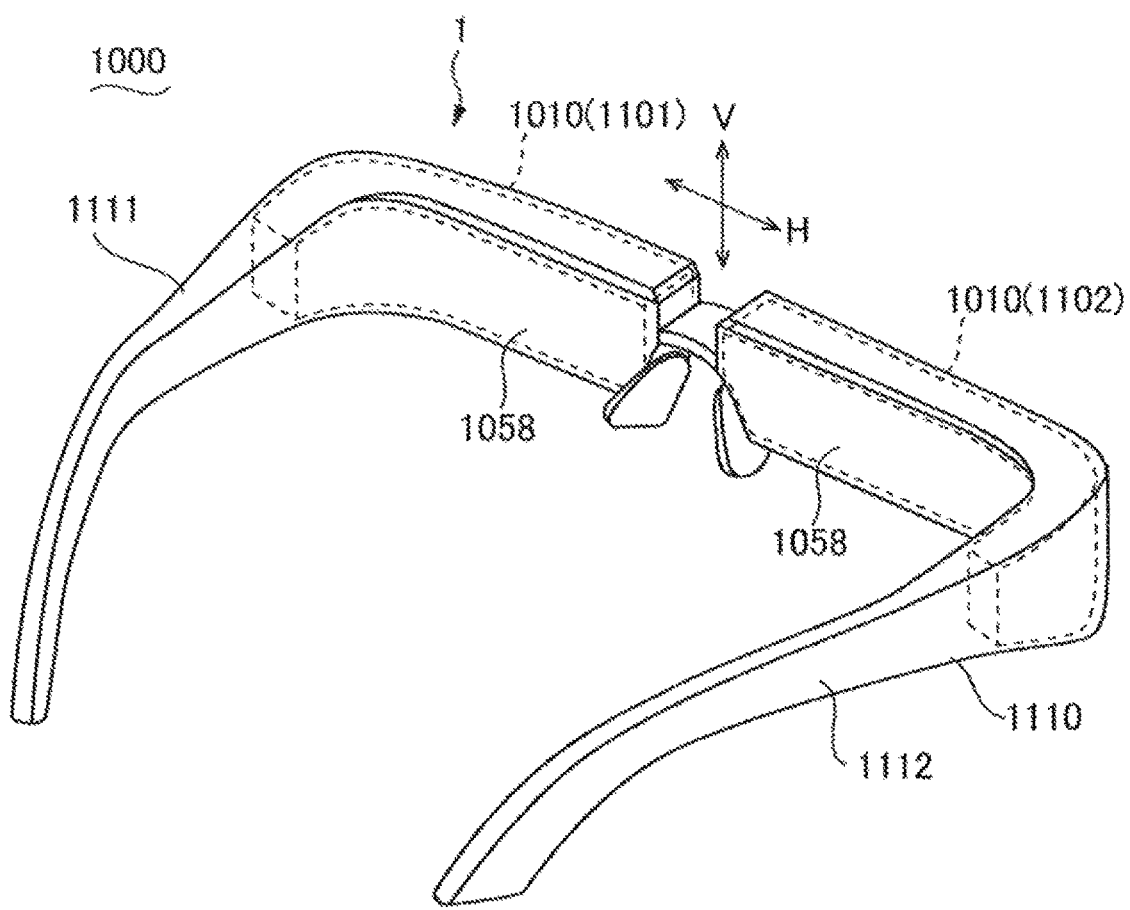
FIG. 11 is an explanatory diagram of a head-mounted type virtual image display device.
Figure 12:
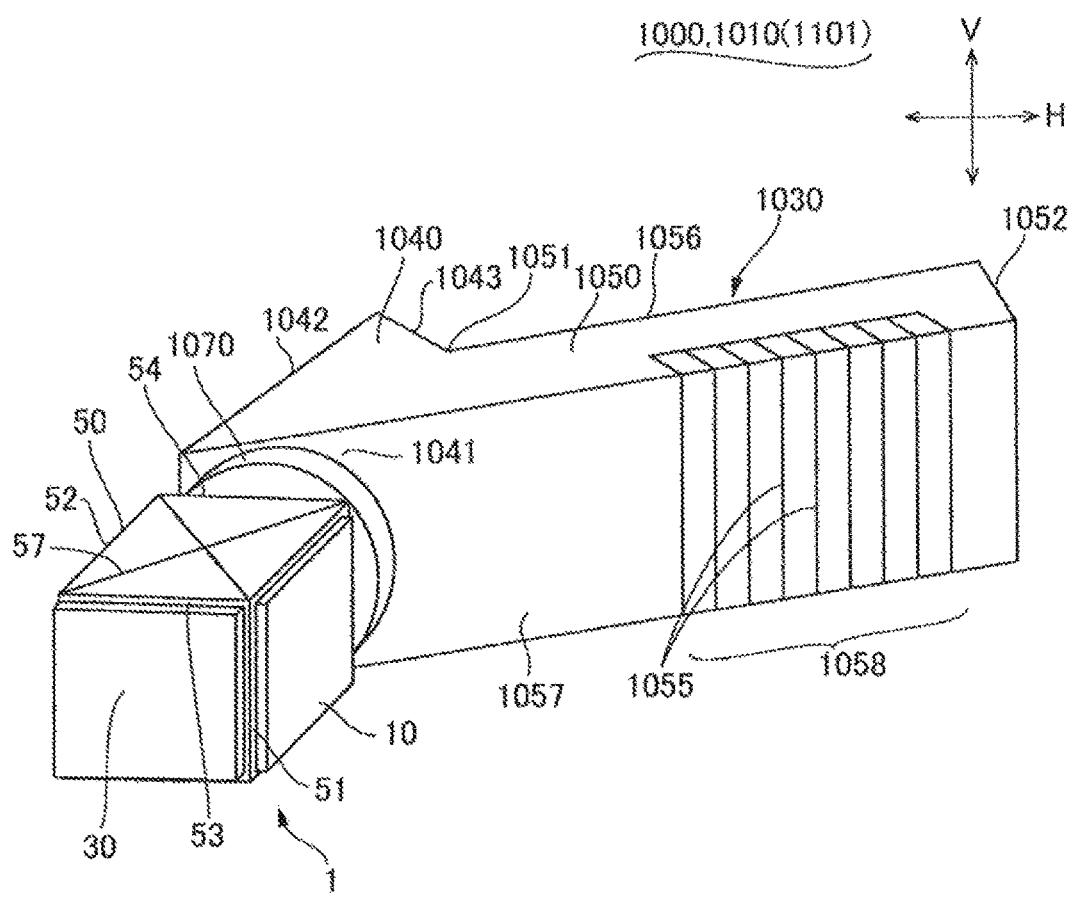
FIG. 12 is a perspective view schematically illustrating a configuration of an optical system of the virtual image display device illustrated in FIG. 11.
Figure 13:
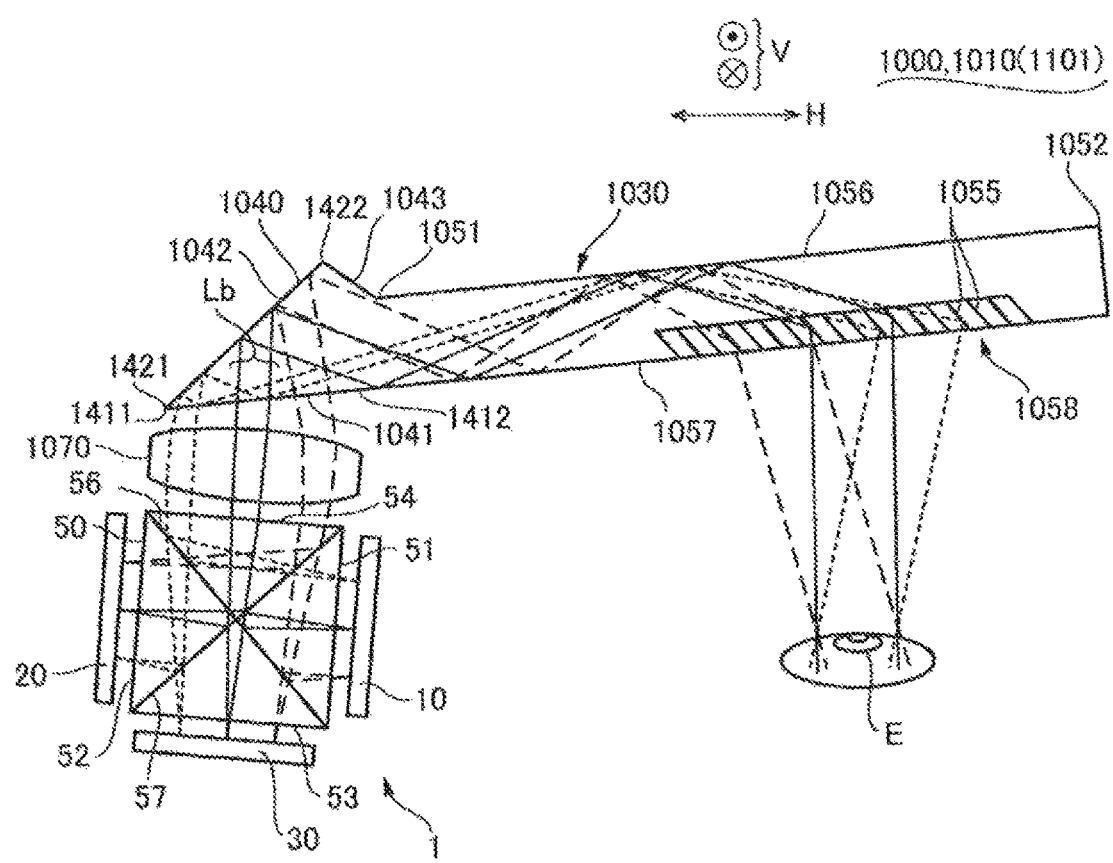
FIG. 13 is an explanatory diagram illustrating light paths of the optical system illustrated in FIG. 12.

FIG. 11 is an explanatory diagram of a head mounted virtual image display device, FIG. 12 is a perspective view schematically illustrating a configuration of an optical system of a virtual image display unit 1010 illustrated in FIG. 11, and FIG. 13 is an explanatory diagram illustrating a light path of the optical system illustrated in FIG. 12.

A virtual image display device 1000, as illustrated in FIG. 11, is configured as a see-through eyeglass display, that is an augmented reality (AR) head-mounted display, and includes a frame 1110 provided with left and right temples 1111 and 1112.

In the virtual image display device 1000, the virtual image display units 1010 are supported by the frame 1110, and an image emitted from the virtual display units 1010 is caused to be recognized as a virtual image by a user.

In the present exemplary embodiment, the virtual image display device 1000 is provided with a left-eye display unit 1101 and a right-eye display unit 1102 as the virtual display units 1010. The left-eye display unit 1101 and the right-eye display unit 1102 that have the same configuration are disposed left-right symmetrically.

Therefore, the left-eye display unit 1101 will be mainly described below, and the description of the right-eye display unit 1102 will be omitted.

In the virtual image display device 1000, the display unit 1101, as illustrated in FIG. 12, includes the image display device 1, and a light guide system 1030 that guides synthesized light Lb emitted from the image display device 1 to an emission unit 1058. A projection lens system 1070 is disposed between the image display device 1 and the light guide system 1030, and the synthesized light Lb emitted from the image display device 1 enters the light guide system 1030 via the projection lens system 1070. The projection lens system 1070 is configured by a single collimate lens that has a positive power.

The light guide system 1030 is provided with a transmissive incident part 1040 on which the synthesized light Lb is incident, and a transmissive light guide unit 1050, one end 1051 side of which is coupled to the incident part 1040. In the present exemplary embodiment, the incident part 1040 and the light guide unit 1050 are configured as an integrated transmissive member.

The incident part 1040 includes an incident surface 1041 on which the synthesized light Lb emitted from the image display device 1 enters, and a reflection surface 1042 that reflects the synthesized light Lb that has entered from the incident surface 1041, the synthesized light Lb being reflected between the reflection surface 1042 and the incident surface 1041.

As illustrated in FIG. 13, the incident surface 1041 is a flat surface, an aspherical surface, a free form surface, or the like, and faces the image display device 1 via the projection lens system 1070. The projection lens system 1070 is disposed obliquely such that an interval between the projection lens system 1070 and an end portion 1412 of the incident surface 1041 is larger than an interval between the projection lens system 1070 and an end portion 1411 of the incident surface 1041. A reflection film or the like is not formed at the incident surface 1041, but the incident surface 1041 fully reflects light that is incident at an incident angle equal to or greater than a critical angle. Thus, the incident surface 1041 has transmittance and reflectivity.

The reflection surface 1042 is a surface facing the incident surface 1041 and is disposed obliquely such that an end portion 1422 of the reflection surface 1042 is separated farther from the incident surface 1041 than from an end portion 1421 of the incident surface 1041. Thus, the incident part 1040 has a substantially triangular shape. The reflection surface 1042 is a flat surface, an aspherical surface, a free form surface, or the like. The reflection surface 1042 can have a configuration in which a reflective metal layer, mainly formed of aluminum, silver, magnesium, chrome or the like, is formed.

The light guide unit 1050 is provided with a first surface 1056 (a first reflection surface) that extends from the one end 1051 to another end 1052 side, a second surface 1057 (a second reflection surface) that faces and extends in parallel to the first surface 1056 from the one end 1051 side to the other end 1052 side, and the emission unit 1058 provided on a section of the second surface 1057 that is separated from the incident part 1040.

The first surface 1056 and the reflection surface 1042 of the incident part 1040 are joined together by an inclined surface 1043. A film thickness of the first surface 1056 and the second surface 1057 is thinner than the incident part 1040. The first surface 1056 and the second surface 1057 reflect all the light that is incident at an incident angle equal to or greater than the critical angle, based on a refractive index difference between the light guide unit 1050 and the outside (the air). Thus, a reflection film and the like is not formed at the first surface 1056 and the second surface 1057.

The emission unit 1058 is configured on a part of the light guide unit 1050 on the second surface 1057 side in the thickness direction of the light guide unit 1050. In the emission unit 1058, a plurality of partial reflection surfaces 1055 that are inclined obliquely with respect to a normal line with respect to the second surface 1057 are arranged so as to be mutually parallel to each other. The emission unit 1058 is a portion, which overlaps the plurality of partial reflection surfaces 1055, of the second surface 1057, and is a region having a predetermined width in an extending direction of the light guide unit 1050. Each of the plurality of partial reflection surfaces 1055 is formed of a dielectric multilayer film. Further, at least one of the plurality of partial reflection surfaces 1055 may be a composite layer of a dielectric multilayer film and a reflective metal layer (thin film) mainly formed of aluminum, silver, magnesium, chrome, or the like. When the partial reflection surface 1055 is configured to include a metal layer, an effect can be obtained to improve the reflectance of the partial reflection surface 1055, or an effect that the incident angle dependence or the polarization dependence of the transmittance and the reflectance of the partial reflection surface 1055 can be optimized. Note that the emission unit 1058 may have a mode in which an optical element, such as a diffraction grating, a hologram, or the like is provided.

In the virtual image display device 1000 configured in this manner, the synthesized light Lb formed of the parallel light incident from the incident part 1040, is refracted by the incident surface 1041 and is oriented toward the reflection surface 1042. Next, the synthesized light Lb is reflected by the reflection surface 1042, and is oriented toward the incident surface 1041 again. At this time, since the synthesized light Lb is incident on the incident surface 1041 at the incident angle equal to or greater than the critical angle, the synthesized light Lb is reflected by the incident surface 1041 toward the light guide unit 1050, and is oriented toward the light guide unit 1050. Note that, in the incident part 1040, the configuration is used in which the synthesized light Lb that is the parallel light is incident on the incident surface 1041, but a configuration may be adopted in which the incident surface 1041 and the reflection surface 1042 are configured to have a free form curve or the like, and after the synthesized light Lb, which is non-parallel light, is incident on the incident surface 1041, the synthesized light Lb is reflected between the reflection surface 1042 and the incident surface 1041 and is converted to the parallel light while being reflected.

In the light guide unit 1050, the synthesized light Lb is reflected between the first surface 1056 and the second surface 1057, and advances. Then, a part of the synthesized light Lb that is incident on the partial reflection surface 1055 is reflected by the partial reflection surface 1055 and is emitted from the emission unit 1058 toward an eye E of an observer. Further, the rest of the synthesized light Lb incident on the partial reflection surface 1055 passes through the partial reflection surface 1055 and is incident on the next, adjacent, partial reflection surface 1055. As a result, the synthesized light Lb that is reflected by each of the plurality of partial reflection surfaces 1055 is emitted from the emission unit 1058 toward the eye E of the observer. Thus, the observer can recognize a virtual image. At this time, light from the outside, passes through the partial reflection surfaces 1055 after entering the light guide unit 1050 from the outside, and reaches the eye E of the observer. This enables the observer to see a color image emitted from the image display device 1 and also see scenery of the outside and the like in a see through manner.

Projector

Next, as an example of the virtual image display device of the present disclosure, a projector including the virtual image display device 1 will be described.

Figure 14:
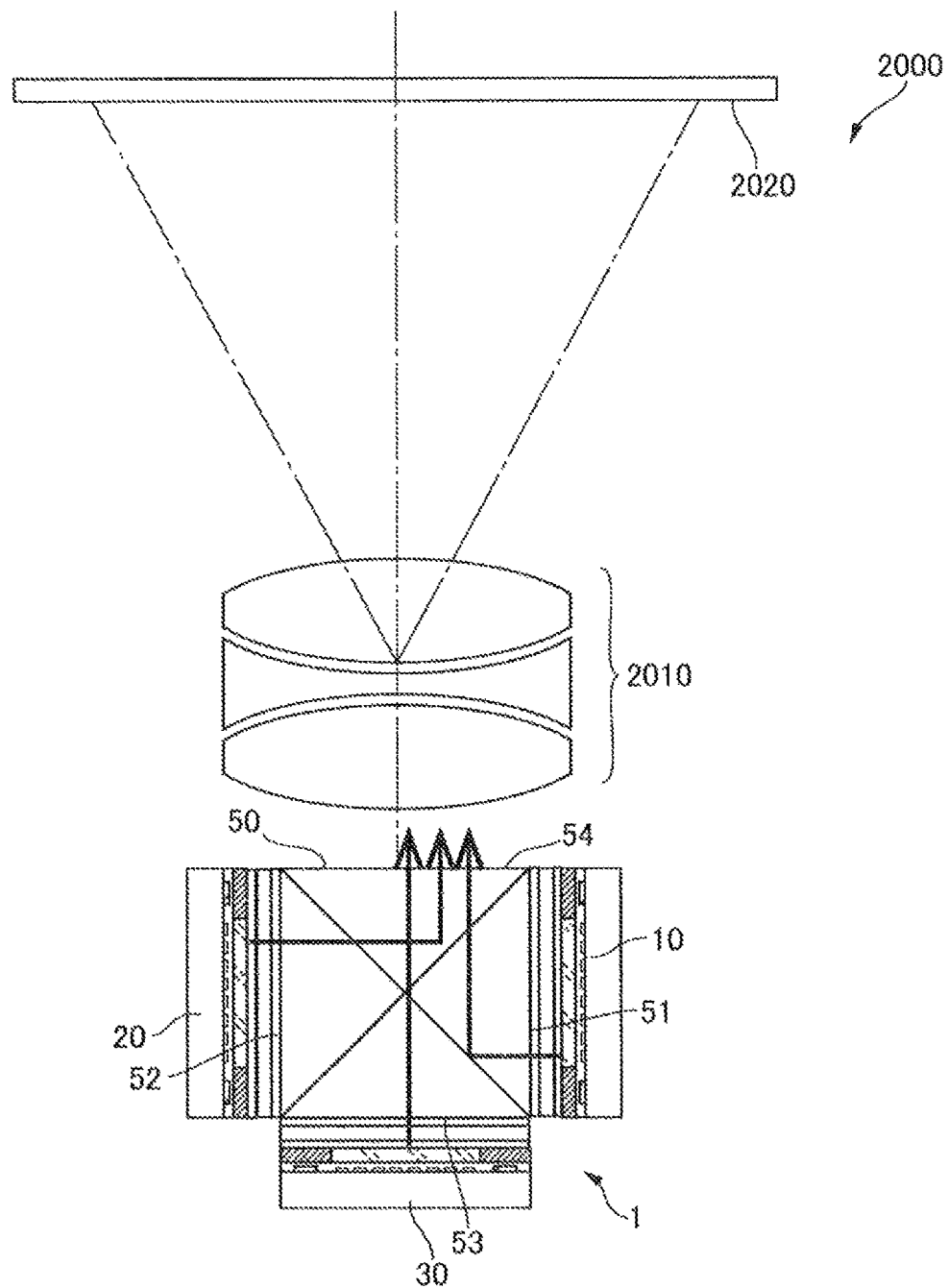
FIG. 14 is an explanatory diagram of a projection-type virtual image display device.

FIG. 14 is an explanatory diagram of a projection-type virtual image display device.

As illustrated in FIG. 14, a virtual image display device 2000 is a projector having the image display device 1, and a projection optical system 2010 that enlarges and projects the synthesized light Lb emitted from the image display device 1 onto a projection member 2020 such as a screen.

According to this virtual image display device 2000, an image formed in the image display device 1 is displayed as being enlarged in the projection member 2020.

Note that, the virtual image display device of the present disclosure can also be applied, in addition to the head-mounted display (HMD) and the projector configured as described above, to a head-up display (HUD) or the like.

The image display device and the virtual image display device of the present disclosure was described above based on the illustrated exemplary embodiments, however the present disclosure is not limited thereto.

For example, in the image display device and the virtual image display device of the present disclosure, any of constitute elements may be replaced with any element capable of exhibiting similar functionality or an element in any configuration may be added.

In addition, in the exemplary embodiment described above, the case in which the image display device 1 includes the organic EL element as the light-emitting element has been described, however, in the present disclosure, the light-emitting element is not limited to an organic EL element, and may be constituted by, for example, a light emitting diode (LED), a micro light emitting diode (µLED), or the like.

Next, specific working examples of the present disclosure will be described.

1. Manufacturing of Light-Emitting Device Working Example 1 Manufacturing of Red Light-Emitting Device A. First, a transparent glass substrate having an average thickness of 0.5 mm was prepared. Next, a first power supply conductor or reflection film constituted by AlCu having an average thickness of 150 nm was formed at this substrate by a sputtering method.

B. Next, an $SiO_2$ layer having an average thickness of 30 nm, an SiN layer having an average thickness of 30 nm, and an $SiO_2$ layer having an average thickness of 155 nm were formed sequentially at the reflection film, by the sputtering method, to form an optical adjusting layer constituted by a laminate in which these layers are laminated.

C. Next, a first electrode or transparent electrode constituted by ITO having an average thickness of 20 nm was formed at the optical adjusting layer, by the sputtering method.

Then, the substrate constituted by these layers was immersed in acetone and 2-propanol in order, and after ultrasonic cleaning, subjected to oxygen plasma treatment and argon plasma treatment. Each of these plasma treatments was performed at a plasma power 100 W, with a gas flow rate 20 sccm, and in a treatment time 5 sec, with the substrate heated to a temperature from 70° C. to 90° C. D. Next, N,N'-di-1-naphthyl-N,N'-diphenylbenzidine (α-NPD) was deposited at the transparent electrode by a vacuum deposition method to form a positive hole transport layer having an average thickness of 30 nm.

E. Next, a constituent material of a light-emitting layer was deposited at the positive hole transport layer by the vacuum deposition method to form a light-emitting layer having an average thickness of 30 nm. For the constituent material of the light-emitting layer, tris[1-phenylisoquinoline-C2,N]iridium(III) ($Ir(piq)_3$) illustrated in Formula (1) below was used as a light-emitting material (guest material), and 4,4'-bis(carbazole-9-yl)biphenyl (CBP) as illustrated in Formula (2) below was used as a host material. Content (doping concentration) of the light-emitting material (dopant) in the light-emitting layer was designated as 5.0 wt %.

Chemical Formula 3

(1)

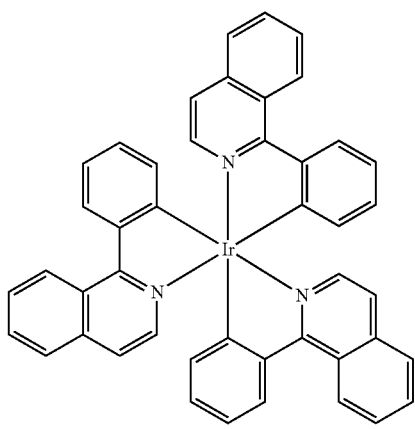

Chemical Formula 4

(2)

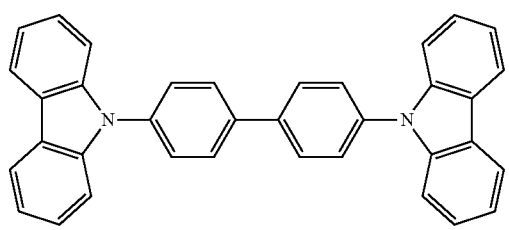

F. Next, 1,3,5-tris(1-phenyl-1H-benzimidazol-2-yl)benzene (TPBi) illustrated in Formula (6) below was deposited at the light-emitting layer by the vacuum deposition method to form a hole block layer having an average thickness of 10 nm.

Chemical Formula 5

(6)

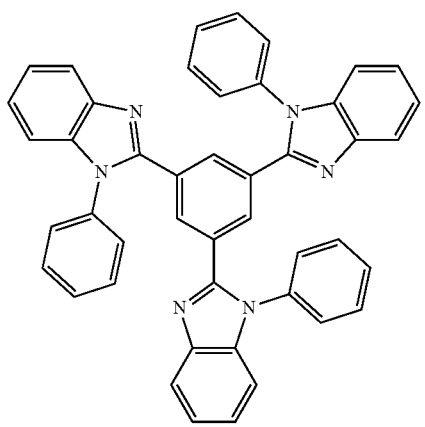

G. Next, 2,9-dimethyl-4,7-diphenyl-1,10-phenanthroline (BCP) was deposited at the hole block layer by the vacuum deposition method to form an electron transport layer having an average thickness of 40 nm.

H. Next, MgAg was deposited at the electron transport layer by the vacuum deposition method to form a second electrode or semi-reflective semi-transmissive electrode or first cathode constituted by MgAg having an average thickness 20 nm.

I. Next, a protective cover (sealing member) made of glass was applied so as to cover the formed layers, and secured and sealed using an epoxy resin.

The red light-emitting device was produced by the above steps.

Manufacturing of Blue Light-Emitting Device

A blue light-emitting device was produced in an identical manner to the red light-emitting device except that, in the above step B, instead of the $SiO_2$ layer having the average thickness of 155 nm, an $SiO_2$ layer having an average thickness of 30 nm was formed, in the step D, a positive hole transport layer having an average thickness of 50 nm was formed, in the above step E, a distyryldiamine compound illustrated in Formula (3) below was used as a light-emitting material (guest material), and an anthracene derivative illustrated in Formula (4) below was used as a host material to form a light-emitting layer, and in the above step F, an electron transport layer having an average thickness of 20 nm was formed.

Chemical Formula 6

(3)

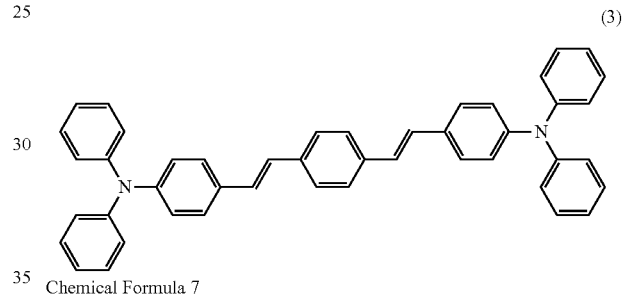

Chemical Formula 7

(4)

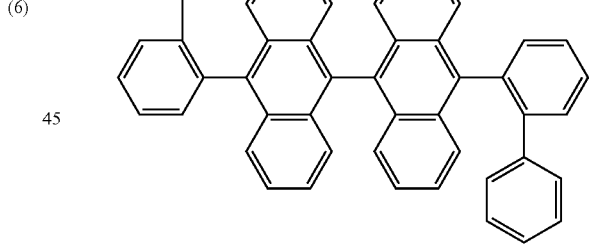

Manufacturing of Green Light-Emitting Device

A green light-emitting device was produced in an identical manner to the red light-emitting device except that, in the above step B, instead of the $SiO_2$ layer having the average thickness of 155 nm, an $SiO_2$ layer having an average thickness of 75 nm was formed, in the above step D, a positive hole transport layer having an average thickness of 40 nm was formed, in the above step E, tris(2-phenylpyridinato)iridium(III) (Ir(ppy)$_3$) illustrated in Formula (5) below was used as a light-emitting material (guest material) to form a light-emitting layer, in the above step F, an electron transport layer having an average thickness of 30 nm was formed, and in the above step G, a semi-reflective semi-transmissive electrode or third cathode having an average thickness of 30 nm was formed.

Chemical Formula 8

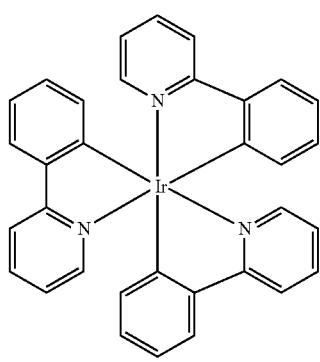

(5)

Working Examples 2 to 14, Comparative Examples 1 to 6

A red light-emitting device, a blue light-emitting device, and a green light-emitting device of each of Working Examples 2 to 14 and Comparative Examples 1 to 6 were manufactured in an identical manner to the above-described Working Example 1, with the exception that thicknesses of semi-reflective semi-transmissive electrodes were changed as illustrated in Table 1, when the semi-reflective semi-transmissive electrodes were a first cathode, a second cathode, and a third cathode, provided in a red light-emitting device, a blue light-emitting device, and a green light-emitting device, respectively.

2. Evaluation

For the red light-emitting device, blue light-emitting device, and green light-emitting device in each of the working examples and the comparative examples, by using a constant current power source (KEITHLEY 2400 manufactured by TOYO Corporation) to flow a constant current of 100 mA/cm$^2$ through each light-emitting device, chromaticity at that time was measured using a high speed spectroradiometer (S-9000, Soma Optics, Ltd.). Then BT.2020 coverages were calculated from obtained chromaticity coordinates for each of the red light-emitting device, the blue light-emitting device, and the green light-emitting device in each of the working examples and the comparative examples.

In addition, for each of the red light-emitting device, the blue light-emitting device, and the green light-emitting device in each of the working examples and the comparative examples, by using the constant current power source (KEITHLEY 2400 manufactured by TOYO corporation) to flow a constant current of 100 mA/cm$^2$ through each light-emitting device, luminance at that time was measured. Then, for each of the working examples and each of the comparative examples, a sum of the luminance of each light-emitting device was determined at the time of flowing such constant current, and subsequently, relative luminance in each of the working examples and each of the comparative examples was determined, with a sum of the luminance in Comparative Example 1 as 100.

These measurement results are shown in Table 1.

Figure 15:
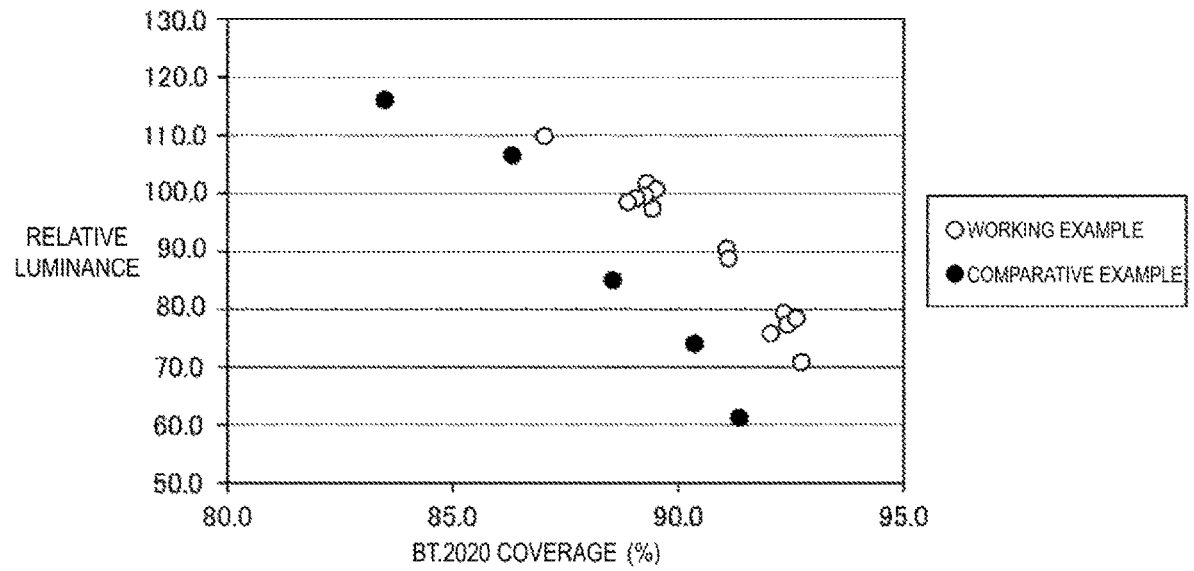
FIG. 15 is a graph illustrating a relationship between relative luminance and BT.2020 coverage of light emitted by an organic EL element in each of working examples and each of comparative examples.

Also, a graph illustrating a relationship between relative luminance of light emitted by an organic EL element, and BT.2020 coverage, in each of the working examples and the comparative examples is illustrated in FIG. 15.

Figure 16:
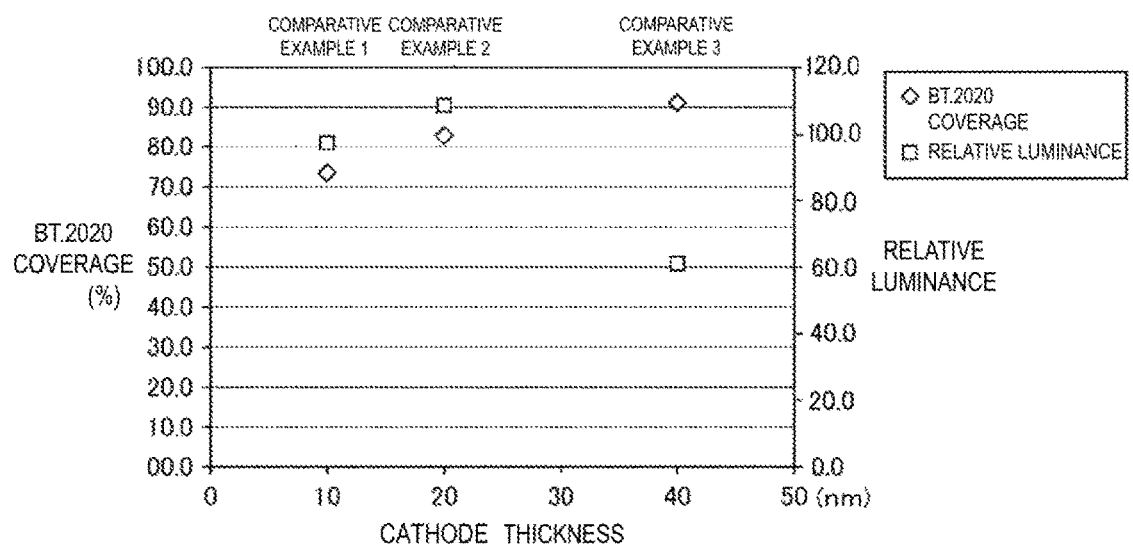
FIG. 16 is a graph illustrating a relationship between BT.2020 coverage, relative luminance of light emitted by an organic EL element in Comparative Examples 1 to 3, and thickness of a cathode included in the organic EL element.

Further, a graph illustrating a relationship between BT.2020 coverage and relative luminance of light emitted by the organic EL element in Comparative Examples 1 to 3, and thickness of a cathode included in the organic EL element is illustrated in FIG. 16.

TABLE 1

| | CATHODE Film Thickness (nm) | | | BT.2020 Coverage | Relative Luminance (Normalized) |
|---|---|---|---|---|---|
| | Red | Green | Blue | | |
| Working Example 1 | 20 | 30 | 20 | 89.3% | 98.2 |
| Working Example 2 | 20 | 30 | 25 | 89.5% | 97.4 |
| Working Example 3 | 20 | 30 | 30 | 89.3% | 96.7 |
| Working Example 4 | 15 | 30 | 30 | 89.4% | 94.5 |
| Working Example 5 | 20 | 40 | 20 | 92.4% | 78.5 |
| Working Example 6 | 20 | 40 | 30 | 92.4% | 77.1 |
| Working Example 7 | 20 | 40 | 25 | 92.6% | 77.8 |
| Working Example 8 | 15 | 40 | 25 | 92.1% | 75.6 |
| Working Example 9 | 10 | 40 | 25 | 92.7% | 71.2 |
| Working Example 10 | 20 | 35 | 20 | 91.1% | 88.5 |
| Working Example 11 | 20 | 35 | 25 | 91.1% | 87.0 |
| Working Example 12 | 20 | 25 | 25 | 87.0% | 105.5 |
| Working Example 13 | 20 | 30 | 35 | 89.1% | 96.0 |
| Working Example 14 | 20 | 30 | 40 | 88.9% | 95.4 |
| Comparative Example 1 | 10 | 10 | 10 | 74.0% | 100.0 |
| Comparative Example 2 | 20 | 20 | 20 | 83.5% | 111.0 |
| Comparative Example 3 | 40 | 40 | 40 | 91.4% | 62.7 |
| Comparative Example 4 | 30 | 25 | 20 | 86.3% | 102.6 |
| Comparative Example 5 | 40 | 30 | 30 | 88.6% | 83.6 |
| Comparative Example 6 | 40 | 35 | 30 | 90.4% | 74.0 |

First, as illustrated in Table 1 and FIG. 16, as is clear from the relationship between BT.2020 coverage and relative luminance of the light emitted by the organic EL element in Comparative Example 1 to 3, and thickness of the cathode included in each organic EL element, by simply changing the semi-reflective semi-transmissive electrodes, that is, the first cathode, the second cathode, and the third cathode, included in the red light-emitting device, the blue light-emitting device, and the green light-emitting device respectively, to have an identical thickness, the BT.2020 cover rate, that is, the color purity and the light emission luminance, were in a tradeoff relationship, and it was not possible to achieve both a high BT.2020 coverage and excellent light emission luminance in a compatible manner.

As illustrated in Table 1, as is clear from the relationship between BT.2020 coverage and relative luminance of the light emitted by the organic EL element in Working Examples 13 and 14, and BT.2020 coverage and relative luminance of the light emitted by the organic EL element in Comparative Examples 4 to 6, in Working Examples 13 and 14, in which the relationship TR<TG was satisfied but the relationship TB≤TG was not satisfied, the BT.2020 coverage of 88.0% or higher and the relative luminance of 95.0 or greater were satisfied, and a high BT.2020 coverage and excellent light emission luminance were achieved in a compatible manner. Compared to this, in Comparative Examples 4 to 6, in which the relationship TB≤TG was satisfied but the relationship TR<TG was not satisfied, one of the BT.2020 coverage of 88.0% or higher, and the relative luminance of 95.0 or higher could not be satisfied, and a high BT.2020 coverage and excellent light emission luminance could not be achieved in a compatible manner.

Furthermore, as illustrated in Table 1 and FIG. 15, as is clear from the relationship between relative luminance and BT.2020 coverage of the light emitted by the organic EL element in each of the working examples and the comparative examples, a result was shown that, for each of the working examples in which the relationship TR<TG was satisfied and each of the comparative examples in which the relationship TR<TG was not satisfied, a high BT.2020 coverage, that is, a coverage of 87.0% or higher, and excellent light emission luminance were relatively achieved in a compatible manner, in each working example, compared to each comparative example. Thus, satisfaction of the relationship TR<TG has been found to be an important parameter to achieve both the high BT.2020 coverage and the excellent light emission luminance in a compatible manner.

What is claimed is:

1. An image display device, comprising:
   a first self-light-emitting display element configured to self-emit light for an image of red light having a peak in a red region;
   a second self-light-emitting display element configured to self-emit light for an image of blue light having a peak in a blue region;
   a third self-light-emitting display element configured to self-emit light for an image of green light having a peak in a green region; and
   a prism having a dichroic mirror configured to synthesize three colors that are the red light emitted from the first self-light-emitting display element, the blue light emitted from the second self-light-emitting display element, and the green light emitted from the third self-light-emitting display element, wherein
   the first self-light-emitting display element, the second self-light-emitting display element, and the third self-light-emitting display element include a first cathode, a second cathode, and a third cathode, respectively, and TR<TG where a film thickness of the first cathode is TR, a film thickness of the second cathode is TB, and a film thickness of the third cathode is TG, and
   a thickness of the first cathode and a thickness of the second cathode satisfy TR≤TB.

2. The image display device according to claim 1, wherein a thickness of the second cathode and a thickness of the third satisfy TB≤TG.

3. The image display device according to claim 1, wherein each of the first cathode, the second cathode, and the third cathode has a film thickness from 10 nm to 40 nm.

4. The image display device according to claim 1, wherein each of the first cathode, the second cathode, and the third cathode is mainly composed of an MgAg alloy.

5. The image display device according to claim 4, wherein a ratio of Mg and Ag (Mg:Ag) in the MgAg alloy is from 1:7 to 1:13.

6. The image display device according to claim 1, wherein the third cathode has a film thickness from 25 nm to 40 nm.

7. The image display device according to claim 1, wherein a BT.2020 coverage achieved by the red light, the blue light, and the green light is not less than 87.0%.

8. The image display device according to claim 1, wherein each of the first self-light-emitting display element, the second self-light-emitting display element, and the third self-light-emitting display element is an organic electroluminescence element.

9. A virtual image display device, comprising the image display device according to claim 1.

10. An image display device, comprising:
    a first self-light-emitting display element configured to self-emit light for an image of red light having a peak in a red region;
    a second self-light-emitting display element configured to self-emit light for an image of blue light having a peak in a blue region;
    a third self-light-emitting display element configured to self-emit light for an image of green light having a peak in a green region; and
    a prism having a dichroic mirror configured to synthesize three colors that are the red light emitted from the first self-light-emitting display element, the blue light emitted from the second self-light-emitting display element, and the green light emitted from the third self-light-emitting display element, wherein
    the first self-light-emitting display element, the second self-light-emitting display element, and the third self-light-emitting display element include a first cathode, a second cathode, and a third cathode, respectively, and TR<TG where a film thickness of the first cathode is TR, a film thickness of the second cathode is TB, and a film thickness of the third cathode is TG,
    each of the first cathode, the second cathode, and the third cathode is mainly composed of an MgAg alloy, and
    a ratio of Mg and Ag (Mg:Ag) in the MgAg alloy is from 1:7 to 1:13.

11. An image display device, comprising:
    a first self-light-emitting display element configured to self-emit light for an image of red light having a peak in a red region;
    a second self-light-emitting display element configured to self-emit light for an image of blue light having a peak in a blue region;
    a third self-light-emitting display element configured to self-emit light for an image of green light having a peak in a green region; and
    a prism having a dichroic mirror configured to synthesize three colors that are the red light emitted from the first self-light-emitting display element, the blue light emitted from the second self-light-emitting display element, and the green light emitted from the third self-light-emitting display element, wherein
    the first self-light-emitting display element, the second self-light-emitting display element, and the third self-light-emitting display element include a first cathode, a second cathode, and a third cathode, respectively, and TR<TG where a film thickness of the first cathode is TR, a film thickness of the second cathode is TB, and a film thickness of the third cathode is TG, and
    a BT.2020 coverage achieved by the red light, the blue light, and the green light is not less than 87.0%.

* * * * *